United States Patent
Ajit

(10) Patent No.: US 7,292,072 B2
(45) Date of Patent: Nov. 6, 2007

(54) SUB-MICRON HIGH INPUT VOLTAGE TOLERANT INPUT OUTPUT (I/O) CIRCUIT

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/182,646

(22) Filed: Jul. 14, 2005

(65) Prior Publication Data

US 2005/0248892 A1 Nov. 10, 2005

Related U.S. Application Data

(60) Continuation of application No. 10/621,005, filed on Jul. 16, 2003, now Pat. No. 6,949,964, which is a division of application No. 10/043,788, filed on Jan. 9, 2002, now Pat. No. 6,628,149.

(60) Provisional application No. 60/260,582, filed on Jan. 9, 2001, provisional application No. 60/260,580, filed on Jan. 9, 2001.

(51) Int. Cl.
*H03B 1/00* (2006.01)
*G11C 5/14* (2006.01)

(52) U.S. Cl. .................... 327/108; 327/530; 327/545

(58) Field of Classification Search ............... None
See application file for complete search history.

(56) References Cited

U.S. PATENT DOCUMENTS

| | | |
|---|---|---|
| 4,473,758 A | 9/1984 | Huntington |
| 4,484,244 A | 11/1984 | Avery |
| 4,556,804 A | 12/1985 | Dewitt |
| 4,617,473 A | 10/1986 | Bingham |
| 4,649,292 A | 3/1987 | Rusznyak |
| 4,686,388 A | 8/1987 | Hafner |
| 4,806,789 A | 2/1989 | Sakihama et al. |
| 5,170,078 A | 12/1992 | Hsueh et al. |
| 5,184,031 A | 2/1993 | Hayakawa et al. |
| 5,208,488 A | 5/1993 | Takiba et al. |
| 5,350,951 A | 9/1994 | Adachi |

(Continued)

FOREIGN PATENT DOCUMENTS

WO   WO 00/38322   6/2000

OTHER PUBLICATIONS

Deng-Yuan Chen, "Design of A Mixed 3.3V and 5V PCI I/O Buffer," *Compass Design Automation*, San Jose, California, U.S.A., 1996.

*Primary Examiner*—Tuan T Lam
(74) *Attorney, Agent, or Firm*—Sterne, Kessler, Goldstein & Fox PLLC

(57) ABSTRACT

A method of providing bias voltages for input output connections on low voltage integrated circuits. As integrated circuit voltages drop generally so does the external voltages that those circuits can handle. By placing input and output devices, in series, external voltages can be divided between the devices thereby reducing junction voltages seen by internal devices. By using external voltages as part of a biasing scheme for integrated circuit devices, stress created by the differential between external voltages and internal voltages can be minimized. Additionally device wells can be biased so that they are at a potential that is dependant on the external voltages seen by the low voltage integrated circuit.

7 Claims, 23 Drawing Sheets

U.S. PATENT DOCUMENTS

| | | |
|---|---|---|
| 5,506,535 A | 4/1996 | Ratner |
| 5,528,447 A | 6/1996 | McManus et al. |
| 5,570,043 A | 10/1996 | Churchill |
| 5,654,858 A | 8/1997 | Martin et al. |
| 5,719,525 A | 2/1998 | Khoury |
| 5,721,508 A | 2/1998 | Rees |
| 5,736,833 A | 4/1998 | Farris |
| 5,781,034 A * | 7/1998 | Rees et al. ............ 326/86 |
| 5,844,425 A | 12/1998 | Nguyen et al. |
| 5,852,375 A * | 12/1998 | Byrne et al. ............ 327/108 |
| 5,909,142 A | 6/1999 | Kawasaki et al. |
| 5,914,626 A | 6/1999 | Kim et al. |
| 5,933,025 A | 8/1999 | Nance et al. |
| 5,933,027 A | 8/1999 | Morris et al. |
| 6,005,413 A | 12/1999 | Schmitt |
| 6,018,257 A | 1/2000 | Hung et al. |
| 6,031,394 A | 2/2000 | Cranford, Jr. et al. |
| 6,054,888 A | 4/2000 | Maley |
| 6,078,487 A | 6/2000 | Partovi et al. |
| 6,081,132 A | 6/2000 | Isbara |
| 6,081,412 A | 6/2000 | Duncan et al. |
| 6,097,237 A | 8/2000 | Singh |
| 6,130,556 A | 10/2000 | Schmitt et al. |
| 6,140,846 A | 10/2000 | Chan et al. |
| 6,147,846 A | 11/2000 | Borg |
| 6,160,428 A | 12/2000 | Pasqualini |
| 6,194,944 B1 | 2/2001 | Wert |
| 6,351,157 B1 | 2/2002 | Sharpe-Geisler |
| 6,362,652 B1 | 3/2002 | Oner et al. |
| 6,388,475 B1 | 5/2002 | Clark et al. |
| 6,429,716 B1 | 8/2002 | Drapkin et al. |
| 6,577,163 B1 | 6/2003 | Waldrip et al. |
| 6,600,346 B1 | 7/2003 | Macaluso |
| 6,639,772 B2 | 10/2003 | Chuang et al. |
| 6,738,242 B1 | 5/2004 | Kwong et al. |

* cited by examiner

SUB-MICRON HIGH INPUT VOLTAGE TOLERANT INPUT OUTPUT (I/O) CIRCUIT

CROSS-REFERENCE TO RELATED APPLICATION(S)

This application is a continuation of application Ser. No. 10/621,005; filed Jul. 16, 2003, now issued as U.S. Pat. No. 6,949,964, which is a divisional of application Ser. No. 10/043,788, filed Jan. 9, 2002, now issued as U.S. Pat. No. 6,628,149; which claimed the priority to and benefit of U.S. Provisional Application No. 60/260,582, filed Jan. 9, 2001, entitled "Sub-Micron, high input voltage tolerant I/O circuit", which is herby incorporated by reference as though set forth in full, and is related to U.S. patent application Ser. No. 10/043,763, filed on Jan. 9, 2002, now issued as U.S. Pat. No. 6,847,248.

This application also claims priority to and benefit of U.S. Provisional Application No. 60/260,580, filed Jan. 9, 2001, entitled "Sub-Micron, high input voltage tolerant I/O circuit with power management support", which is hereby incorporated by reference as though set forth in full.

FIELD OF THE INVENTION

The present invention relates to integrated circuits (ICs), such as interface circuits, that are designed having reduced feature sizes, for example, 0.13 µm. More particularly, the invention relates to ICs that include interfaces (such as input/output (I/O) circuits) that are capable of interfacing with comparatively high-voltage signals from other sources, for example a 3.3 volt IC interfacing with signals from a 5 volt IC, or any other disparate ranges. Moreover, the invention relates to integrated circuits in which the semiconductor devices are biased such that the stress across the gate-oxides and junctions, as well as the leakage currents, are maintained at tolerable levels.

BACKGROUND OF THE INVENTION

The trend in CMOS-based processing technology is to produce integrated circuit (IC) cores having a higher density of semiconductor devices, such as transistors, and faster clock rates than their predecessors. I/O circuits, which electrically couple an IC core to external components, are accessed through I/O circuit pads that surround the IC core. The IC core and the I/O circuit pads are generally fabricated from the same processing technology. There is however no requirement that they comprise the same technology and hybrid circuits are known in the art. The inventive concepts herein are applicable to a variety of fabrication technologies.

The performance of the IC cores may generally be improved by shrinking the feature sizes of the semiconductor devices, for example field-effect transistors (FETs). Unfortunately, reducing the IC feature sizes may proportionally decrease the maximum operating voltage that the semiconductor devices within the IC can withstand. For example, an I/O circuit pad, fabricated from a CMOS process having 0.30 micron features, typically withstands a maximum operating voltage of about 3.6 volts. In such a case the maximum operating voltage of the I/O circuit pad is insufficient to drive the external components which have a higher voltage requirement, such as 5 volts. Furthermore, if the IC is interfaced with a greater than the maximum operating voltage, the IC may fail.

One way to attempt to resolve such requirements of circuits with mismatched voltage requirements is to increase the robustness of the fabrication process, for example by increasing the thickness of the gate-oxide layer of the semiconductor devices which comprise the IC circuitry. A thick gate-oxide layer may provide semiconductor devices, such as FETs, with the ability to support a higher voltage requirement. However, this voltage robustness is commonly accompanied by a decreases the performance of the IC, because the thick gate-oxide layer reduces the overall gain of the devices which comprise the IC. Reducing the gain minimizes the benefit which occurs by reducing the feature size.

Other attempts have included increasing the complexity of the CMOS fabrication process so there are multiple sets of devices where each set meets different voltage requirements. Each set of devices requires a different gate-oxide. Each additional gate-oxide requires a separate mask. The resulting hybrid process may significantly increase the manufacturing costs of the IC.

One way to avoid the drawbacks of the aforementioned processing-based solutions is to use a "level-shift" chip as an external component. The IC core and the I/O circuits are fabricated from the same process. The "level-shift chip" may be fabricated from a process that supports the discrete voltage requirement by stepping up the core output signals to support the discrete voltage range and stepping down the external drive signals to support the IC core voltage range. Such a level-shift chip can be a waste of much needed space on a crowded printed circuit board and may degrade performance.

An I/O circuit that transforms voltages between different voltage levels without degrading the overall performance of the integrated circuit and maximizing use of space on the printed circuit board or multi-chip substrate may be beneficial. It would be a further benefit if such an I/O circuit could use voltages presented at the I/O circuit in order to provide such protective biasing.

Commonly an I/O power supply may vary +/−10% and may vary significantly more during transient conditions. When the I/O power supply varies, circuits may have higher stress on the gate-oxides of the devices in the I/O circuit, such stresses may not be desirable in many process technologies. It may be desirable to provide bias voltages to various devices in the I/O circuit such that the device gate-oxide is protected from high-voltages under various conditions of operation even when the power-supply voltage varies by a large amount.

Embodiments of the present invention may be optimized, for example where 5 volt input tolerance is required, even when the power supplies are varying in steady state by +/−10%.

Embodiments of the present invention are illustrated in an optimized form for I/O circuits where a 5 volt +/−10% input tolerance is required for normal operating range. Additionally the inventive concepts herein are described in terms of CMOS (Complimentary Metal Oxide Semiconductor) integrated circuits. Those skilled in the art will readily appreciate the fact that techniques described with respect to CMOS ICs are readily applicable to any circuits having disparate power supply and/or drive signal requirements for different portions of the circuitry. The CMOS example chosen is one likely to be familiar to those skilled in the art. There is, however, no intent to limit the inventive concepts to CMOS ICs as the techniques are equally applicable to a wide variety of integrated circuit fabrication techniques.

SUMMARY OF EMBODIMENTS OF THE INVENTION

An exemplary embodiment of the invention includes an integrated circuit having a four device input output circuit in a push pull configuration. Two of the devices, termed upper devices, comprise PMOS (P-Channel Metal Oxide Semiconductor) devices and two of the devices, termed lower devices, comprise NMOS (N-channel Metal Oxide Semiconductor) devices. The devices are biased to eliminate hazardous voltages across device junctions and to reduce the magnitude of the voltage being passed on to the core circuitry. The biases are derived from the input output state of the circuit and the voltage presented to the I/O circuit connection ($V_{PAD}$) Additionally PMOS device well bias voltage may be developed based on $V_{PAD}$.

BRIEF DESCRIPTION OF THE DRAWINGS

Other features and advantages of the invention will become apparent from a description of the following figures, in which like numbers refer to similar items throughout.

DETAILED DESCRIPTION OF EMBODIMENTS OF THE INVENTION

Figure 1:
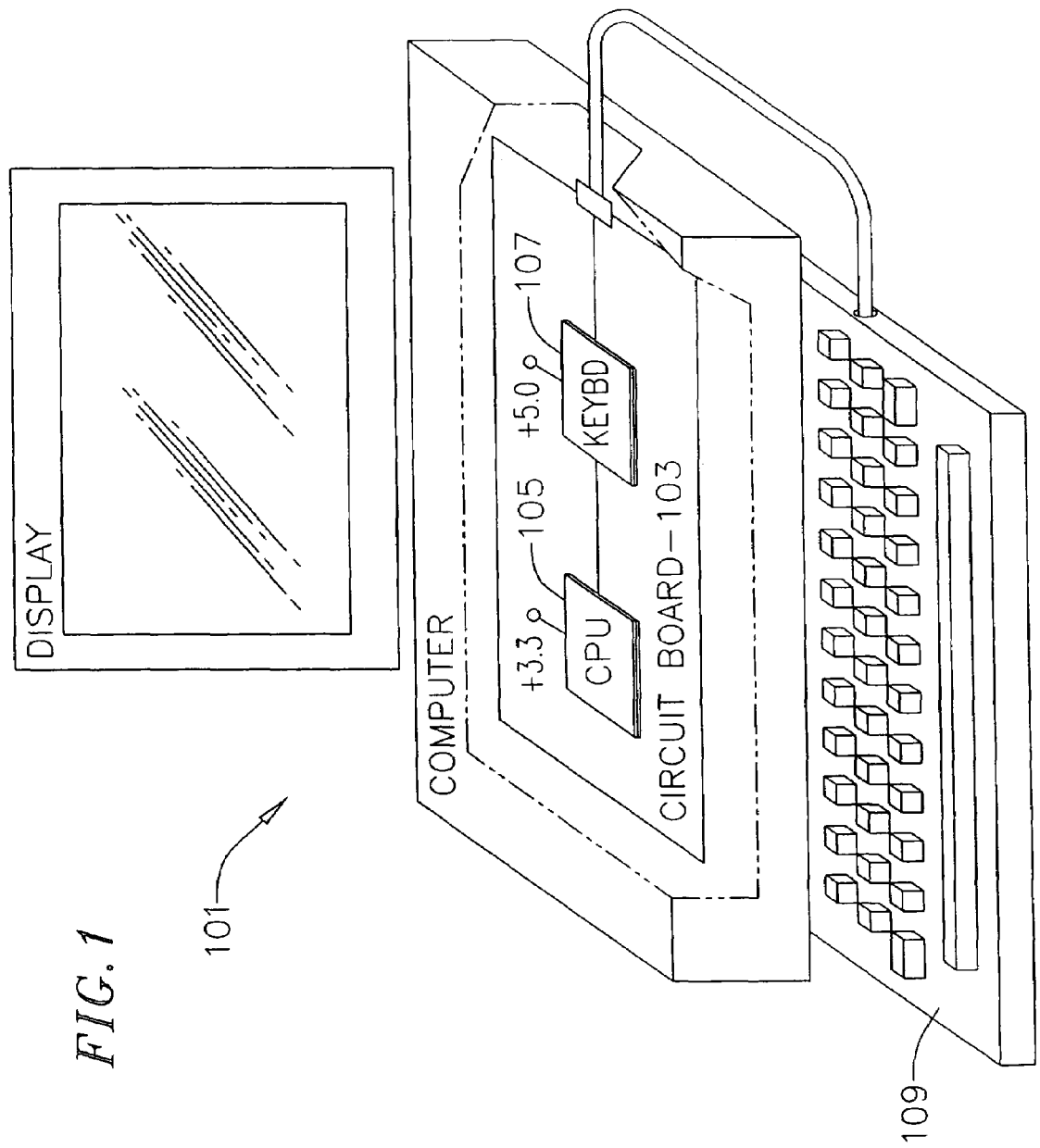
FIG. 1 is a graphic illustration of an exemplary environment in which embodiments of the invention may be utilized.

FIG. 1 is a graphic illustration of an exemplary environment in which embodiments of the invention may be utilized. In FIG. 1 a personal computer system is represented generally at 101. Within the computer system is circuit board 103 on which a CPU integrated circuit chip 105 is mounted. The CPU is a type which uses 3.3 volts as its supply voltage. A keyboard interface integrated circuit chip 107 is also mounted on circuit board 103. The keyboard interface integrated circuit uses a supply voltage of 5.0 volts. The CPU 105 is coupled to the Keyboard chip 107. The CPU 105 may be of a type which contains integrated devices that may be damaged by interfacing with a device having a higher supply voltage. Because of the disparity in supply voltages that may exist in such situations an output circuit which can compensate for the higher interface voltages may be useful.

Figure 2:
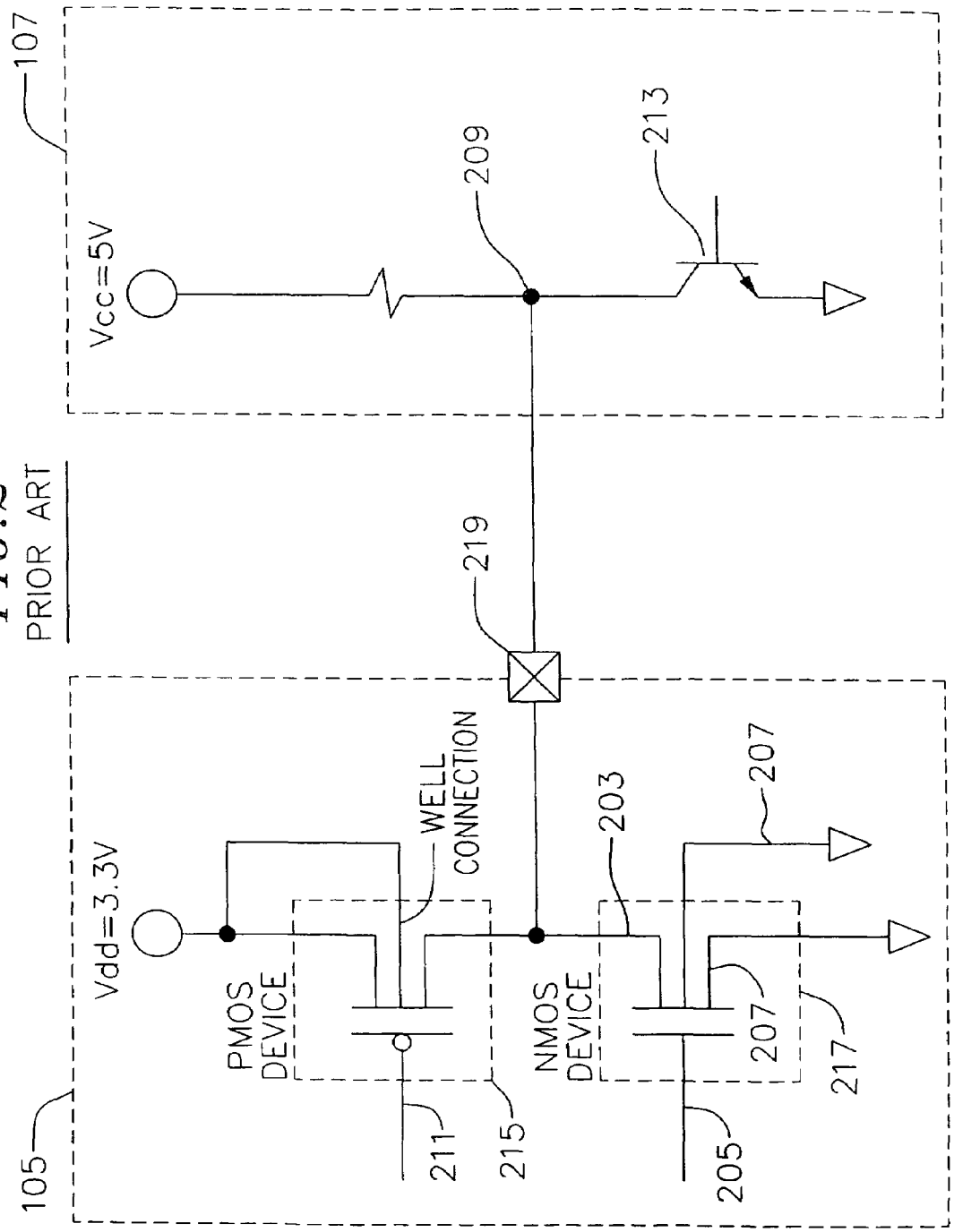
FIG. 2 is a graphical illustration of a prior art input output circuit and connection.

FIG. 2 is a graphical illustration of a prior art input output circuit and connection. A common input output circuit comprises a pull up device, such as PMOS (P-channel Metal Oxide Semiconductor) device 215 and a pull down device, such as NMOS (N-channel Metal Oxide Semiconductor) device 217, such as illustrated in FIG. 2. Devices 215 and 217 are coupled together at an input/output (I/O) pad 219. The substrate for the NMOS device is commonly coupled to ground potential, e.g. as shown at 221. The substrate for the NMOS device is typically a substrate which is common for the entire integrated circuit chip on which it resides. PMOS devices are commonly fabricated in their own isolated well.

In deep submicron fabrication, the component integrated devices can tolerate only limited differential voltages across their junctions. Commonly the voltage which can be tolerated across the junctions is on the order of 2.5 Volts.

In the Illustration of FIG. 2 pad 219 interfaces to a 5 volt circuit, and hence the pad may commonly see voltages in the neighborhood of 5.5 volts. A 5 volt signal applied to pad 219 may stress devices within the chip 105. For example if gate 205 of device 217 is at a zero volt potential then the voltage across the 205-203 gate-oxide can exceed 5 volts, thereby stressing device 217. For this reason more than one device may be used to divide the voltages in pull up and pull down I/O circuits.

Figure 3:
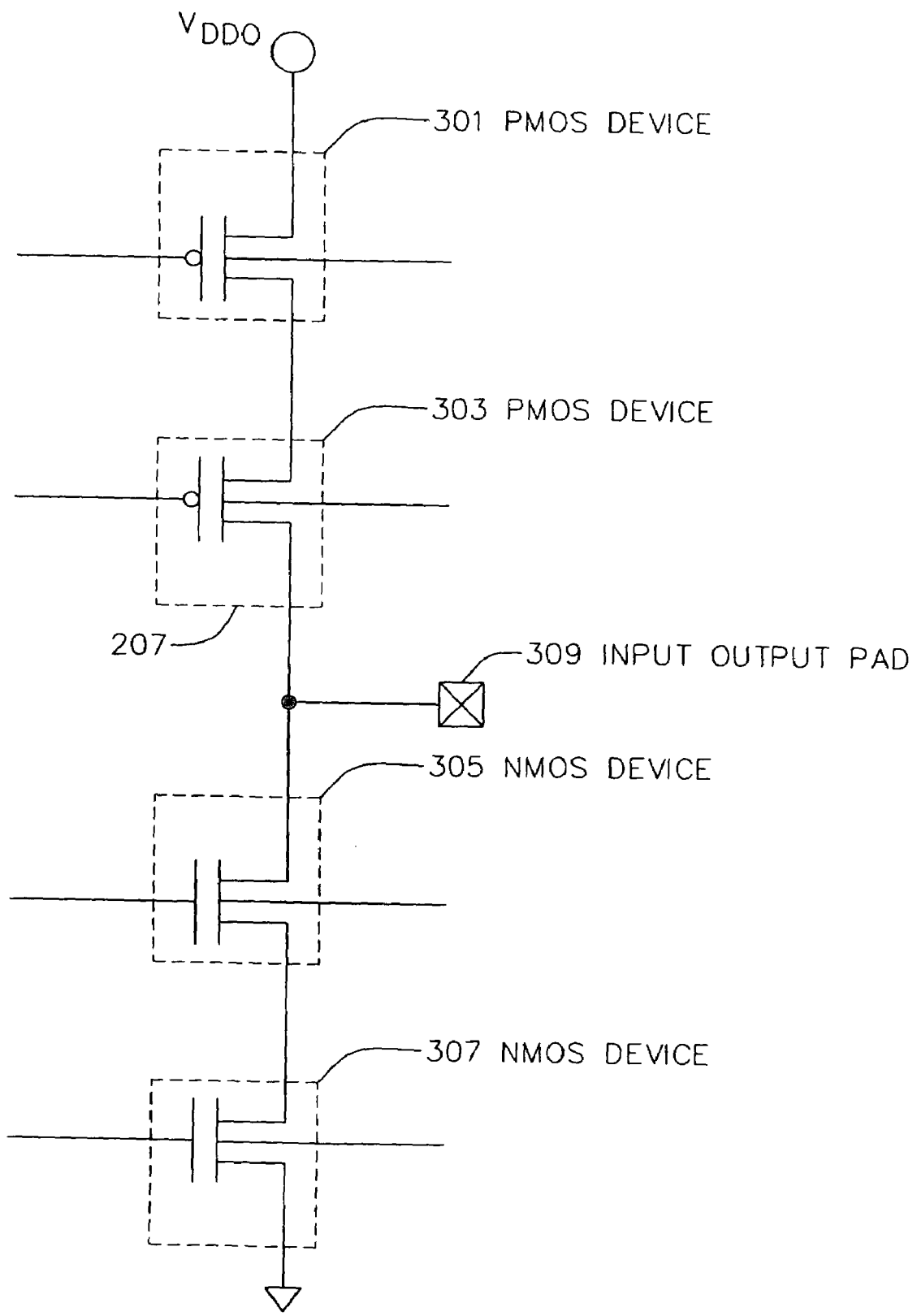
FIG. 3 is a schematic of a portion of a CMOS (Complimentary Metal Oxide Semiconductor) input output circuit in which single push pull output devices, as illustrated in FIG. 2, have been replaced by two devices each.

FIG. 3 is a schematic of a portion of a MOS (Metal Oxide Semiconductor) input output circuit in which each push pull output device illustrated in FIG. 2 has been replaced by two devices. That is output device 215 has been replaced by devices 301 and 303 and device 217 has been replaced by devices 305 and 307. By replacing devices 215 and 217 by two devices each, the output voltage appearing at pad 309 may be safely divided over the two upper (301 and 303) and the two lower (305 and 307) I/O devices. The middle NMOS device 303 and the middle PMOS device 305 have their gates biased to intermediate potentials to avoid excessive voltages under various I/O pad, 309, voltages.

Figure 4:
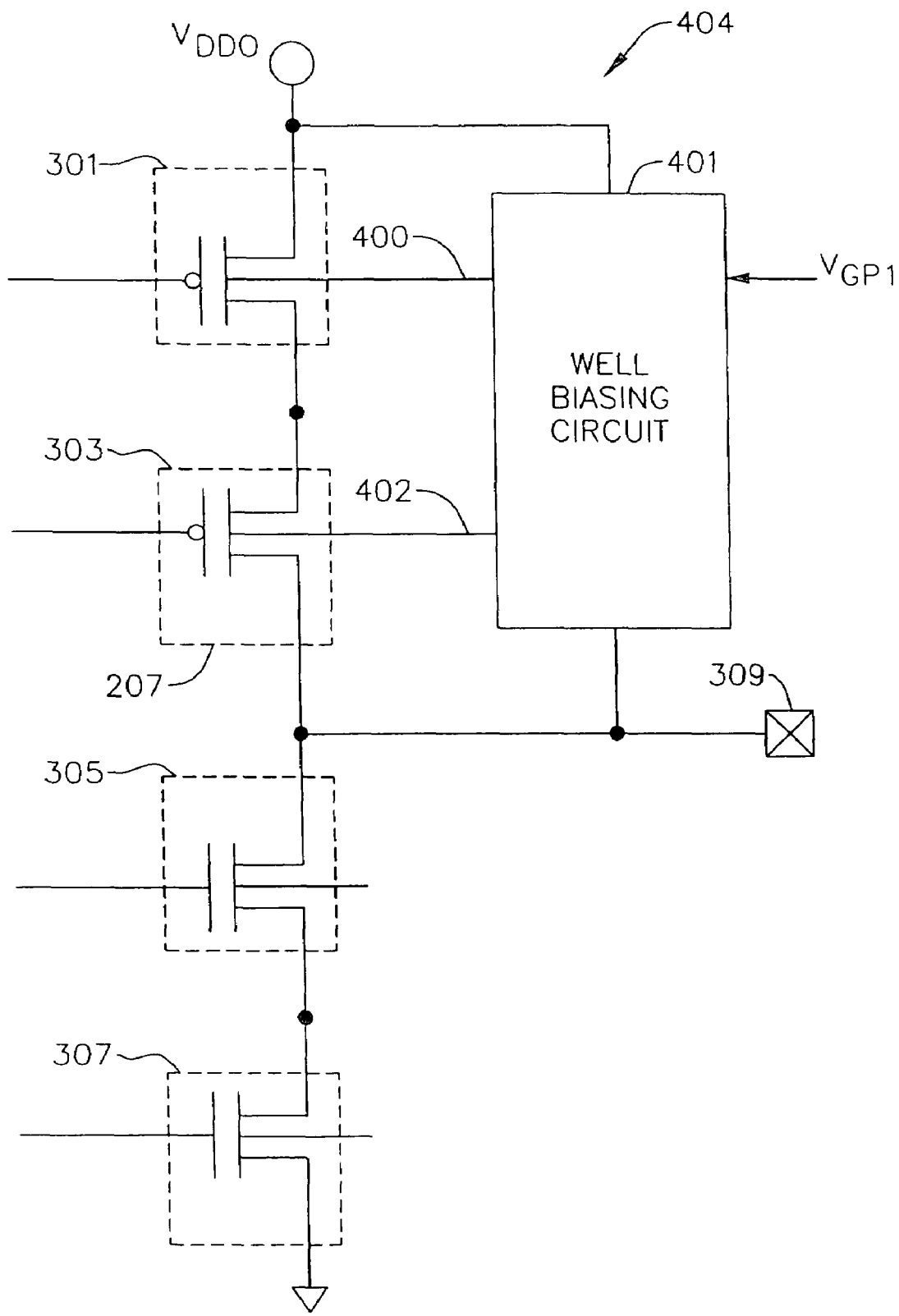
FIG. 4 is input output circuit, including a well biasing circuit, according to an embodiment of the invention.
Figure 7:
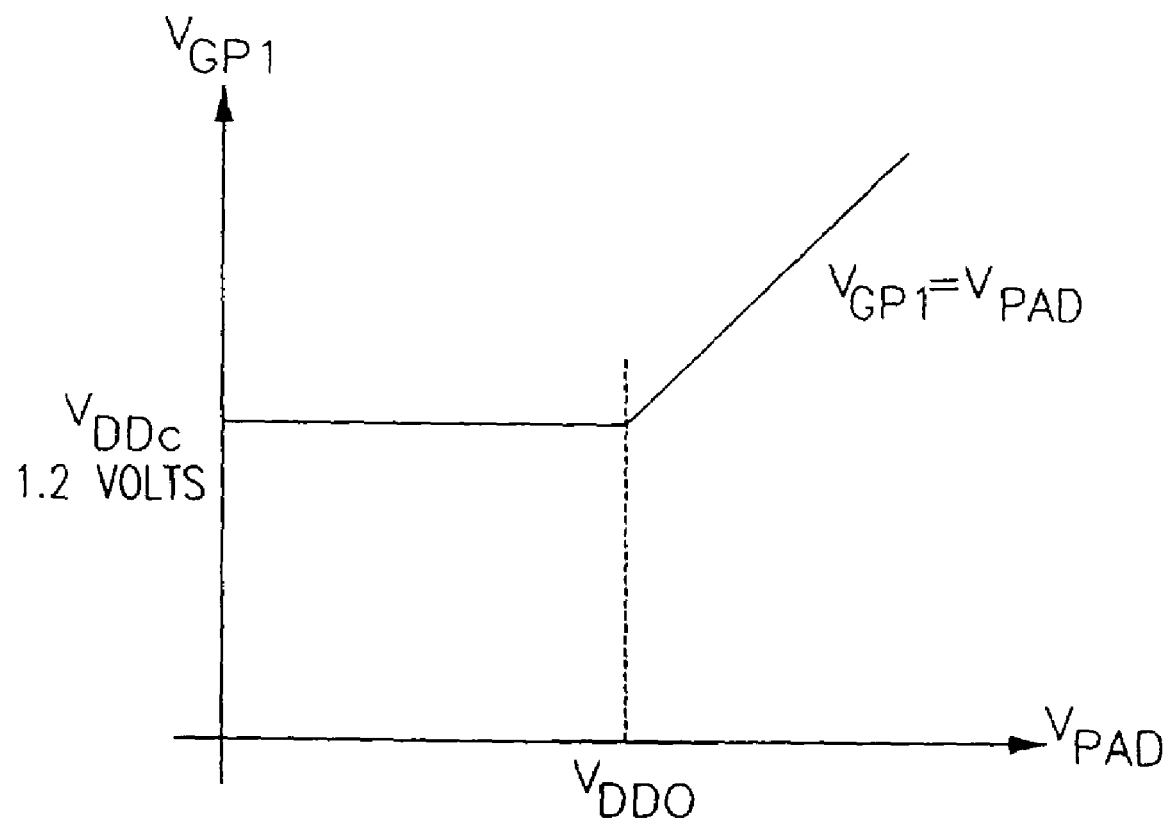
FIG. 7 is a graphical representation of a bias voltage ($V_{GP1}$) as a function of pad voltage ($V_{PAD}$), according to an embodiment of the invention.

FIG. 4 is input output circuit 404, including a well biasing circuit, according to an embodiment of the invention. Devices 301 and 303 are fabricated in wells, illustrated schematically as 400 and 402, which are essentially at a floating potential. Because devices in wells at floating potential can have problems, such as device latch up, wells may commonly be coupled to a known bias voltage. The wells of devices 301 and 303 are coupled to the highest circuit potential available using well biasing circuit 401. The inputs to the well biasing circuit are the pad voltage present on input output pad 309, $V_{DDO}$ and voltage $V_{GP1}$ which are illustrated in FIG. 7.

During the operation of input output circuit 404, in an output mode (when pad 309 is in an output driving mode), wells 400 and 402 are coupled to $V_{DDO}$. When the pad 309 is in an input mode, the well voltage depends upon the pad voltage. In the output enable mode $V_{well}=V_{DDO}$.

When input output circuit 404 is in an input mode (when pad 309 is in an input mode), $V_{well}$ depends on both the input (Pad) voltage $V_{PAD}$ and $V_{DDO}$. If $V_{PAD}$ is less than $V_{DDO}$ when input output circuit 404 in the input mode then $V_{well}=V_{DDO}$. If $V_{PAD}$ is greater than $V_{DDO}$ then $V_{well}=V_{PAD}$. A graph of this relationship is illustrated in FIG. 5.

Figure 5:
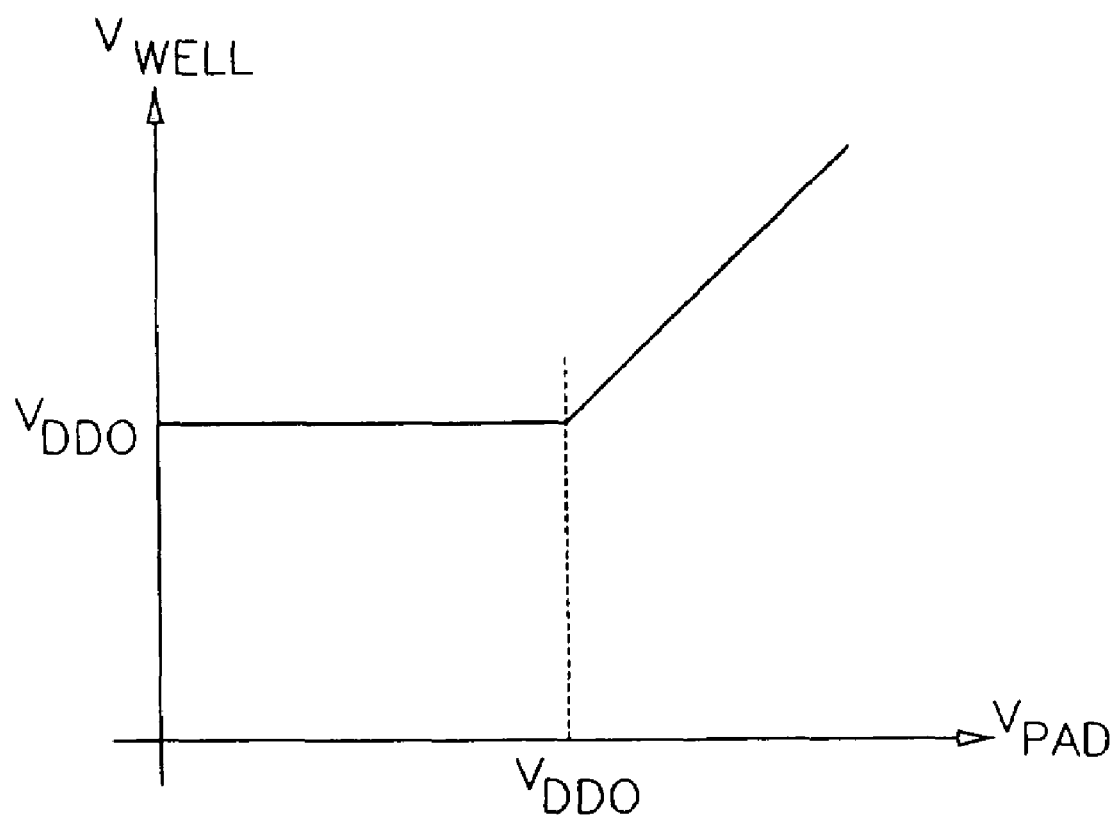
FIG. 5 is a graph illustrating the relationship between well voltage and pad voltage for the input (or a tristate) mode, according to an embodiment of the invention.

FIG. 5 is a graph illustrating the relationship between well voltage and pad voltage for the I/O circuit in an input (or a tristate) condition. As can be seen from the graph, if the pad voltage is less than $V_{DDO}$ then the well voltage is equal to $V_{DDO}$. If the pad voltage is greater than $V_{DDO}$ then the well voltage is equal to the pad voltage. The well bias can thereby be changed according to changing circuit conditions.

Figure 6:
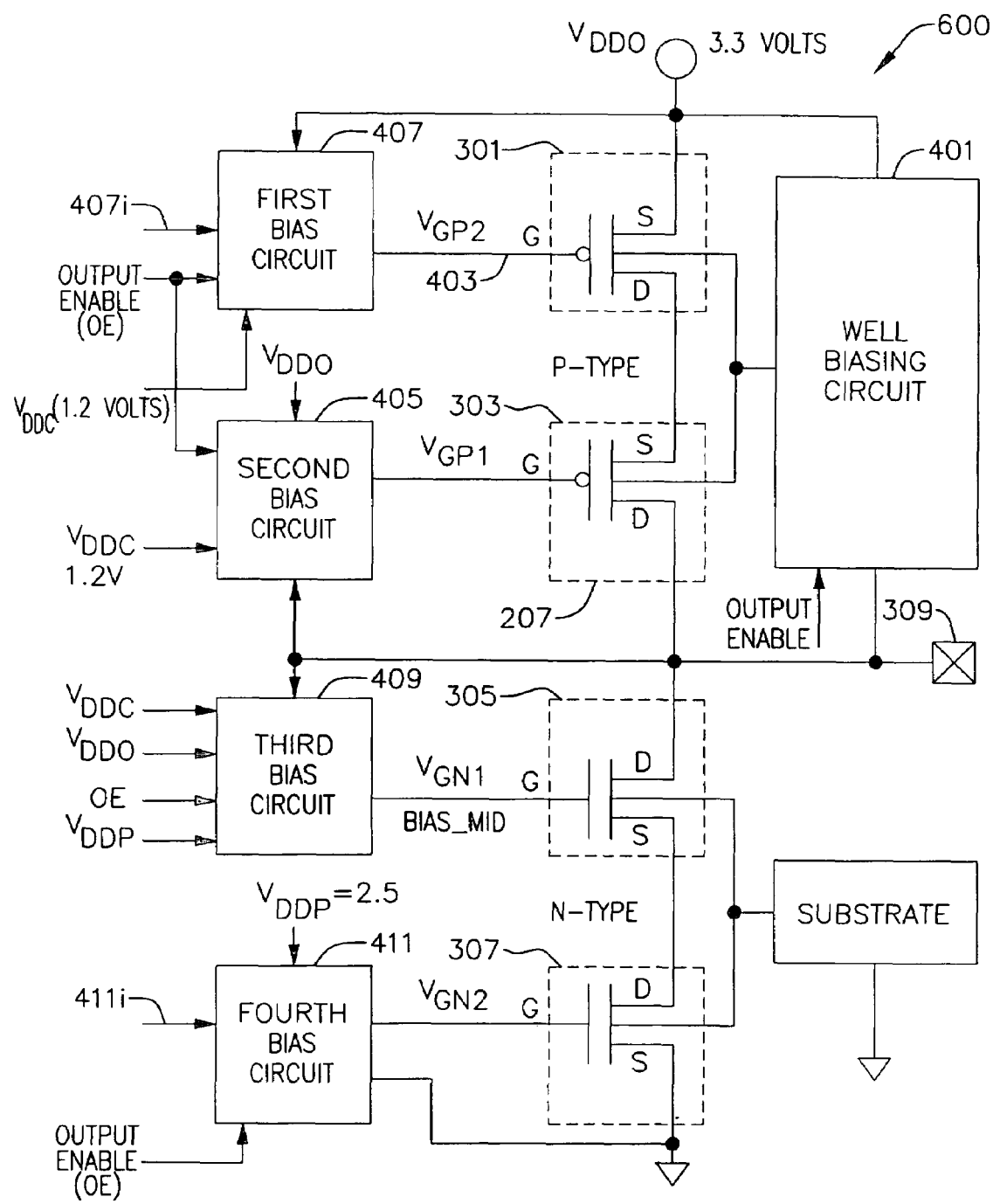
FIG. 6 is a block diagram of I/O circuitry biasing according to an embodiment of the invention.

FIG. 6 is a block diagram of I/O circuitry 600 biasing according to an embodiment of the invention.

When I/O circuitry 600 is in the input mode, first bias circuit 407 ties gate 403 of device 301 to $V_{DDO}$. In the output mode device 301 is controlled by an input from first bias circuit 407 according to whether a high or low value is being output on the pad 309.

In the input mode second bias circuit 405 provides gate voltage $V_{GP1}$ to the gate of output device 303. The gate voltage $V_{GP1}$ provided to the gate of output device 303 varies from an intermediate power supply voltage, such as $V_{DDC}$ being equal to 1.2 volts, and the pad voltage presented to the circuit at input output pad 309. Such biasing prevents device 303 from being damaged due to a voltage potential across its junctions.

FIG. 7 is a graphical representation of $V_{GP1}$ bias voltage as a function of pad voltage ($V_{PAD}$). If $V_{PAD}$ is less than $V_{DDO}$, then $V_{GP1}$ provided to the gate of output device 303 is equal to the intermediate supply voltage $V_{DDC}$. If $V_{PAD}$ is greater than $V_{DDO}$ then $V_{GP1}$ provided to the gate of output device 303 is equal to $V_{PAD}$. In such a manner the voltage between the gate of device 303 and pad 309 can be kept in a safe range to prevent damage to the junction.

To summarize the operation of the circuit of FIG. 6, when the circuit 600 is in an output mode: The well biasing circuit 401 ties the wells of devices 301 and 303 to $V_{DDO}$. The gate of the lower PMOS device 307 is tied to an intermediate voltage, such as $V_{DDC}$=1.2 Volts. The gate of upper NMOS device 305 is tied to an intermediate voltage, such as $V_{DDP}$=2.5 Volts.

When the circuit 600 is in not in output mode, that is in the tri-state or input mode then upper PMOS device 301 and lower NMOS device 307 are turned off and devices 303 and 305 are turned on to divide the voltages of the output circuit.

The gate voltage of the upper NMOS device 305 is controlled by third bias circuit 409. Third bias circuit 409, when in an input or tristate mode, will increase the base voltage when the pad voltage increases beyond a certain threshold, for example $V_{DDP}$ equal to 2.5 Volts.

Fourth bias circuit 411 works in a similar fashion to first bias circuit 407. Both bias circuits 407 and 411 work in a digital mode, either providing a first or second voltage depending on the required I/O pad 309 output voltage. In a first mode of operation first bias circuit 407 switches between a first voltage $V_{DDO}$ and a second lower voltage $V_{DDC}$. Gate bias circuit 411 switches between providing $V_{DDP}$ and ground potential to the gate of device 307.

Figure 8:
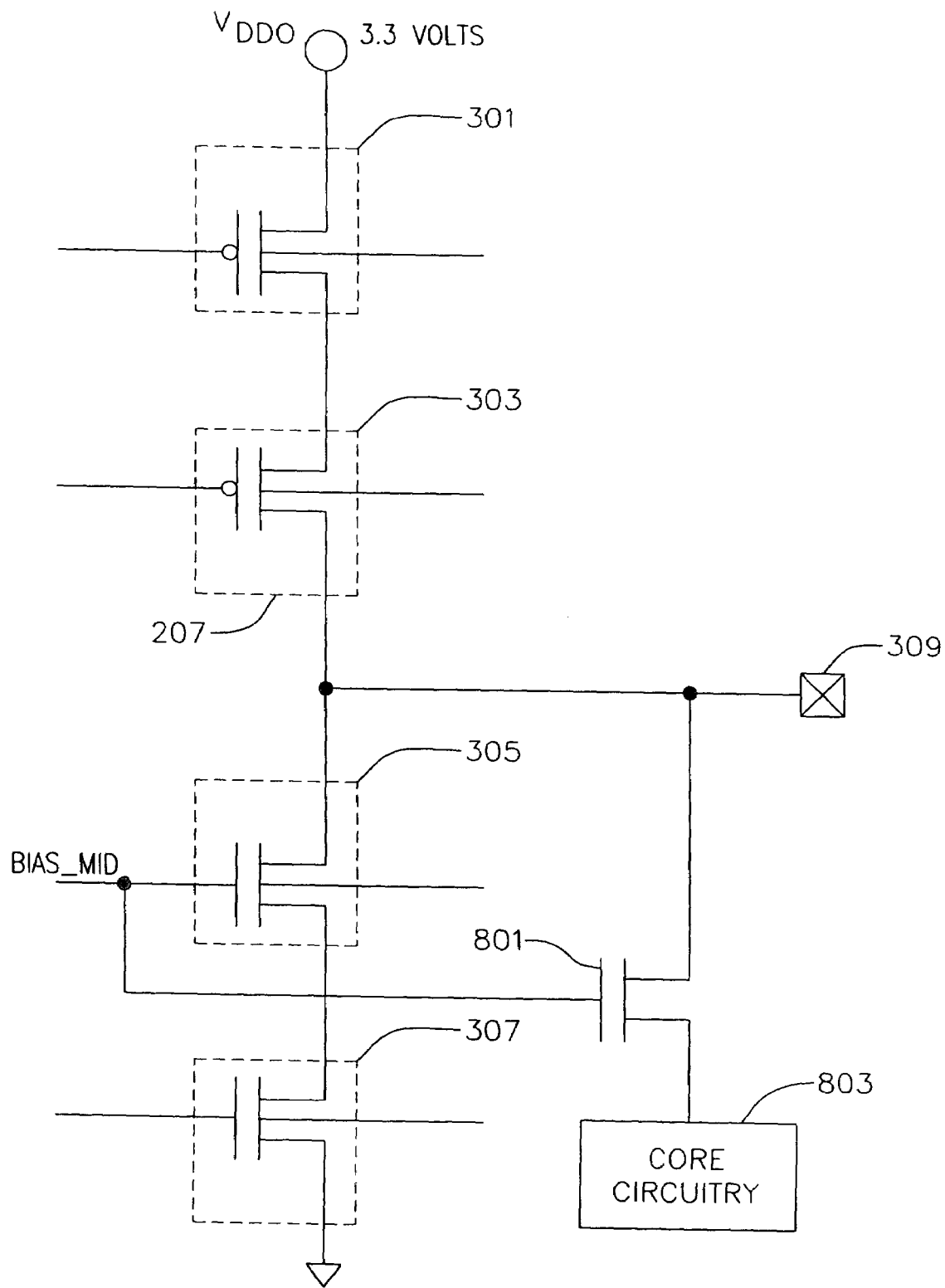
FIG. 8 is a graphical illustration of a portion of a circuit configuration used to provide the pad voltage to the core circuitry, according to an embodiment of the invention.

FIG. 8 is a graphical illustration of a circuit configuration used to provide the pad voltage to the core circuitry. The $V_{PAD}$ input is coupled to the core circuitry 803 through an NMOS device 801. The gate of NMOS device 801 accepts Bias_Mid as its control voltage. Such an arrangement protects the gate source voltage of device 801 and also prevents large voltages from the input from bing coupled into the core circuitry when it is in the input, (tristate) or output conditions.

One facet of the I/O system comprising devices 301, 303, 305 and 307 is that any number of such devices may be added in parallel, in order to provide any level of drive signals needed.

Figure 9A:
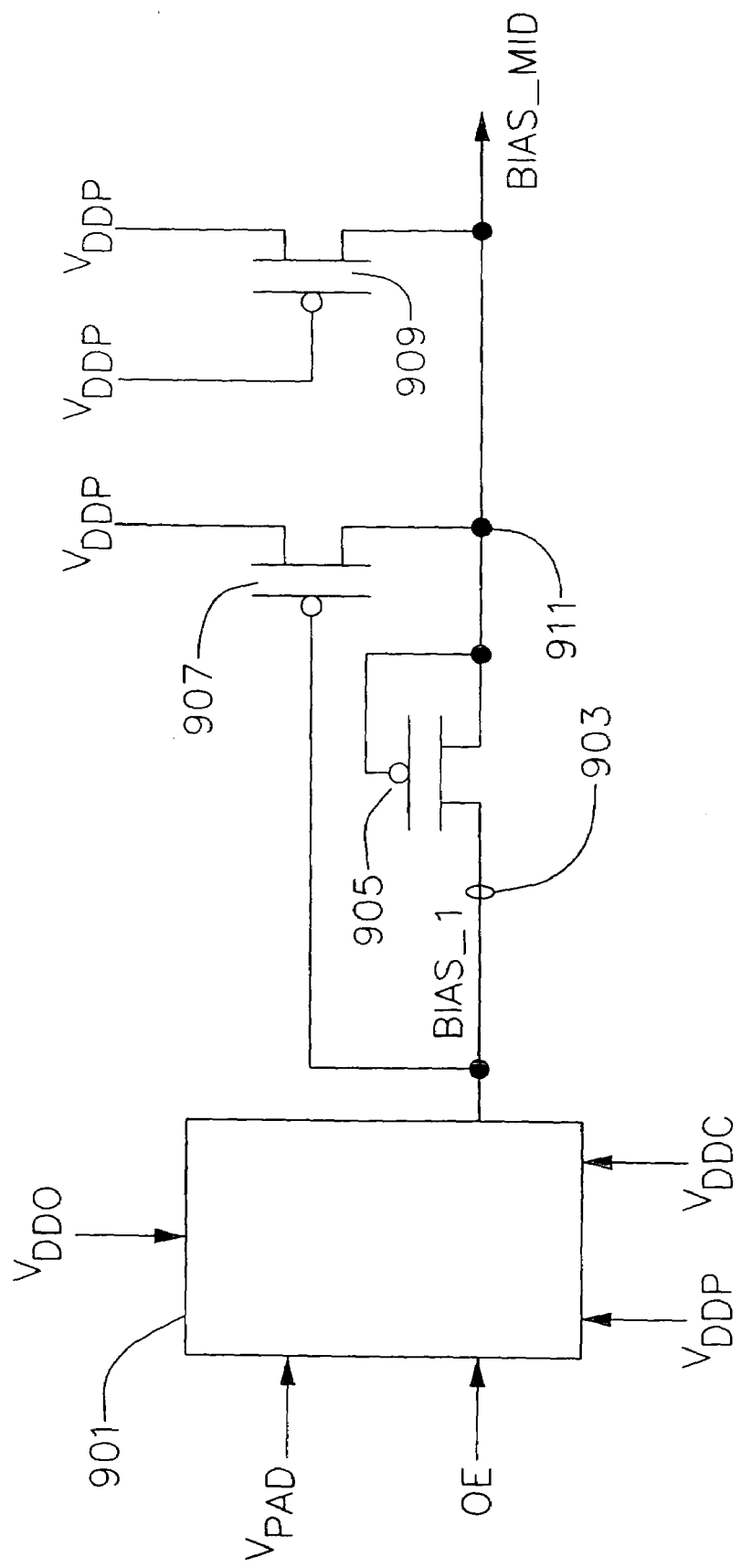
FIG. 9A is a schematic diagram of the generation of Bias_Mid voltage, according to an embodiment of the invention.

FIG. 9A is a schematic diagram illustrating how Bias_Mid voltage is generated. Block 901 is a switching circuit that switches its Bias_1 output between voltages $V_{DDO}$ (3.3 Volts nominally in the present embodiment) and $V_{DDC}$ (1.2 Volts nominally in the present embodiment). Device 905 is a PMOS device as are devices 907 and 909. Device 907 turns on when the output is enabled or the $V_{PAD}$ is low. When device 907 is turned on, Bias_Mid is coupled to $V_{DDP}$. When output is not enabled i.e. the pad is in the tri-state (input only) mode and $V_{PAD}$ is high, then Bias_1 is equal to $V_{DDO}$ and device 905 charges point 911 to Bias_1 minus $V_{TP}$, where $V_{TP}$ is the threshold of device 905, and accordingly is the voltage dropped across device 905. If Bias_Mid is greater than the sum of $V_{DDP}$ and $V_{TP}$, then device 909 will drain current from node 911 such that the sum of $V_{DDP}$ plus $V_{TP}$ is the maximum value for Bias_Mid. Bias_Mid is always between ($V_{DDP}+V_{TP}$) and ($V_{DDO}-V_{TP}$), whether ($V_{DDP}+V_{TP}$) or ($V_{DDO}-V_{TP}$) is larger. A typical value of the threshold voltage $V_{TP}$ is 0.5 volts. The actual value of Bias_Mid will be determined by the relative sizes of devices 907 and 909.

Figure 9B:
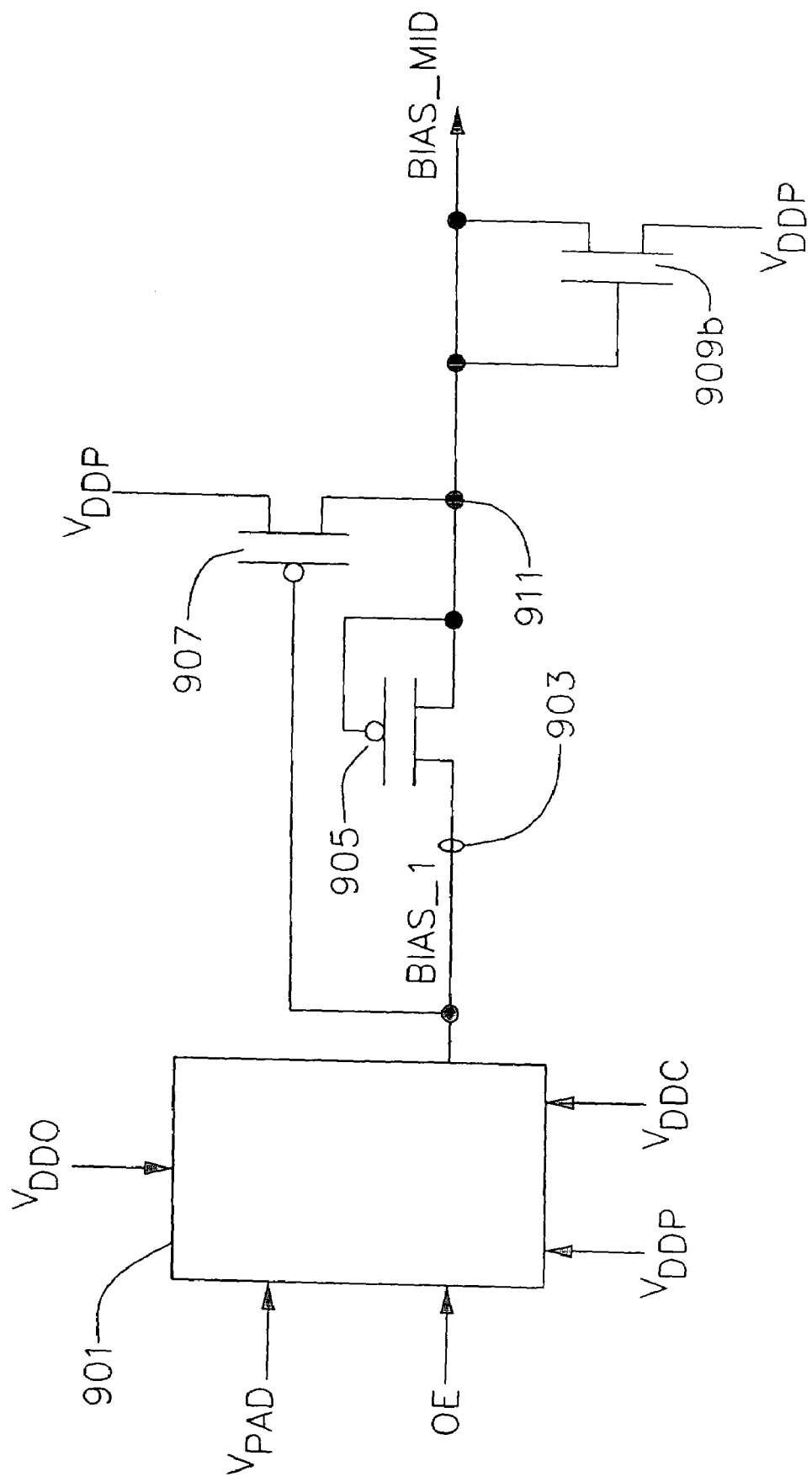
FIG. 9B is a schematic diagram of an alternative embodiment for the generation of Bias_Mid voltage, according to an embodiment of the invention.

FIG. 9B is a schematic diagram of an alternate embodiment illustrating how Bias_Mid voltage is generated in an alternate embodiment. Block 901 is a switching circuit that switches its Bias_1 output between voltages $V_{DDO}$ (3.3 Volts nominally in the present embodiment) and $V_{DDC}$ (1.2 Volts nominally in the present embodiment). Device 905 is a PMOS device as is device 907. Device 909B is a NMOS device. Device 907 turns on when the output is enabled or the $V_{PAD}$ is low. When device 907 is turned on, Bias_Mid is coupled to $V_{DDP}$. When output is not enabled i.e. the pad is in the tri-state (input only) mode and during this time when $V_{PAD}$ is high, then Bias_1 is equal to $V_{DDO}$ and device 905 charges point 911 to Bias_1 minus $V_{TP}$, where $V_{TP}$ is the threshold of device 905, and accordingly is the voltage dropped across device 905. If Bias_Mid is greater than the sum of ($V_{DDP}+V_{TP}$) then device 909b will drain current from node 911 such that ($V_{DDP}+V_{TP}$) is the maximum value for Bias_Mid. Bias_Mid is always between ($V_{DDP}+V_{TN}$)

and ($V_{DDO}-V_{TP}$), whether ($V_{DDP}+V_{TN}$) or ($V_{DDO}-V_{TP}$) is larger. A typical voltage value for the threshold voltage $V_{TP}$ is 0.5 volts. The actual value of Bias_Mid will be determined by the relative sizes of devices 907 and 909b.

Figure 9C:
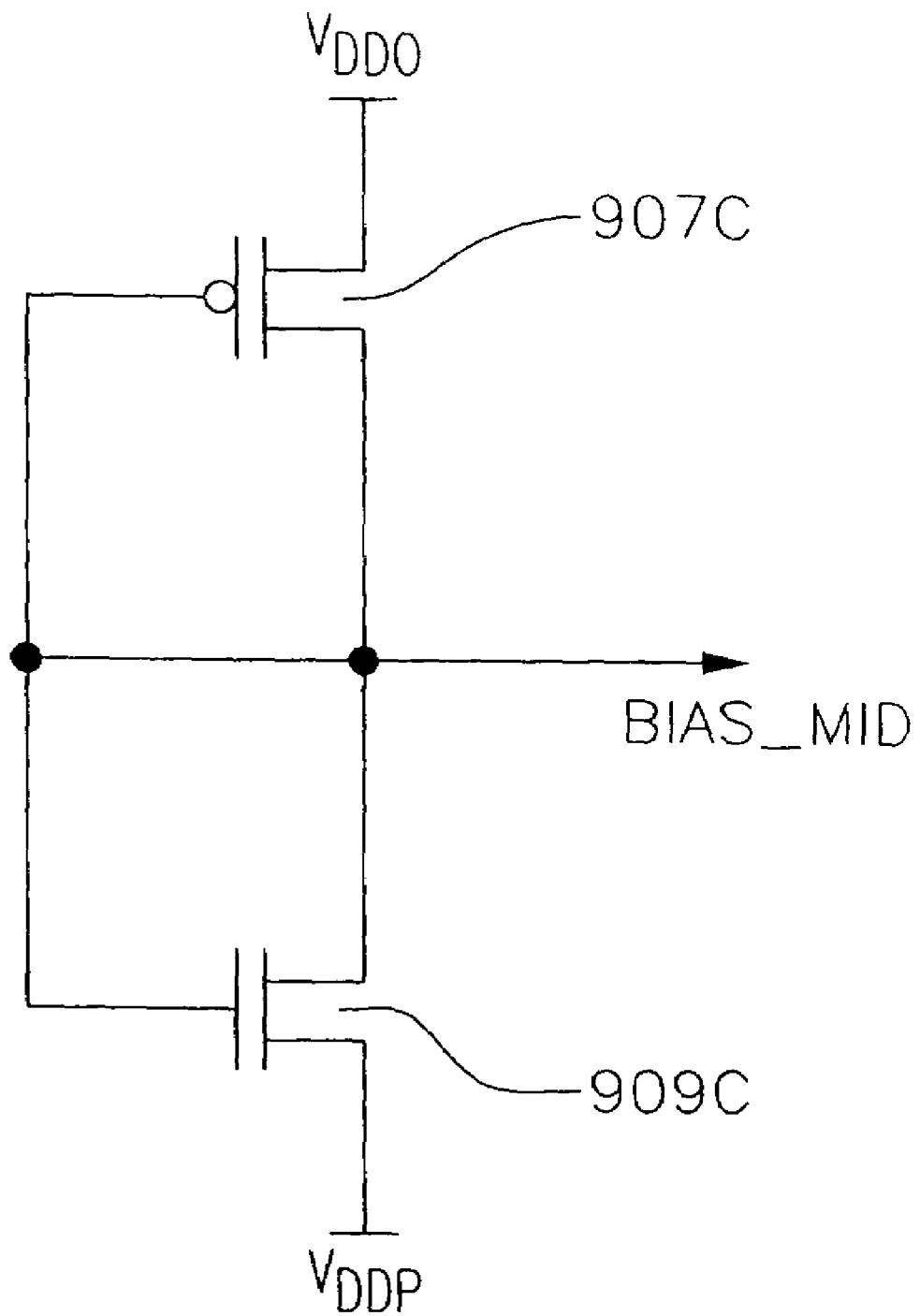
FIG. 9C is a schematic diagram of yet another alternative embodiment for generation of Bias_Mid voltage, according to an embodiment of the invention.

FIG. 9C is a schematic diagram of yet another alternate embodiment for generation of Bias_Mid voltage. In this circuit Bias_Mid is always less than ($V_{DDP}+V_{TP}$) and greater than ($V_{DDO}-V_{TN}$).

Figure 10:
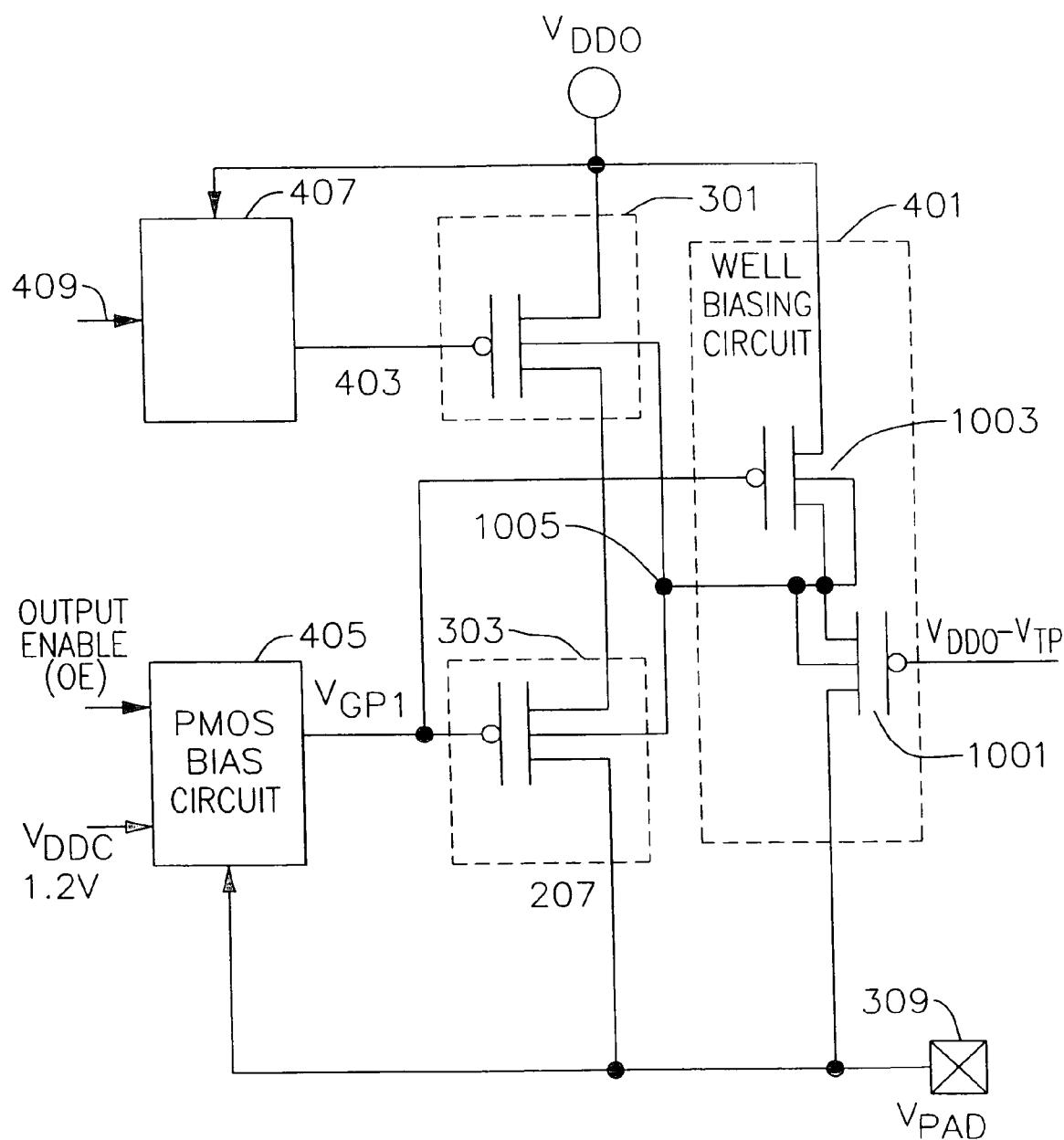
FIG. 10 is a schematic diagram of an exemplary well biasing circuit, according to an embodiment of the invention.

FIG. 10 is a schematic diagram of an exemplary well biasing circuit, according to an embodiment of the invention. Device 1001, when turned on, couples the I/O pad 309 to the well 1005. Device 1003, when turned on, couples $V_{DDO}$ to the well 1005. When $V_{PAD}$ is less than $V_{DDO}$ the gate source of device 1001 is less than the threshold voltage of device 1001, and device 1001 is turned off. When $V_{GP1}$ is low (e.g. 1.2 Volts) then device 1003 conducts, thereby tying the well 1005 to $V_{DDO}$. When $V_{PAD}$ is equal to $V_{DDO}$ or greater then device 1001 will begin to turn on, thereby coupling the well 1005 to $V_{PAD}$.

Figure 11A:
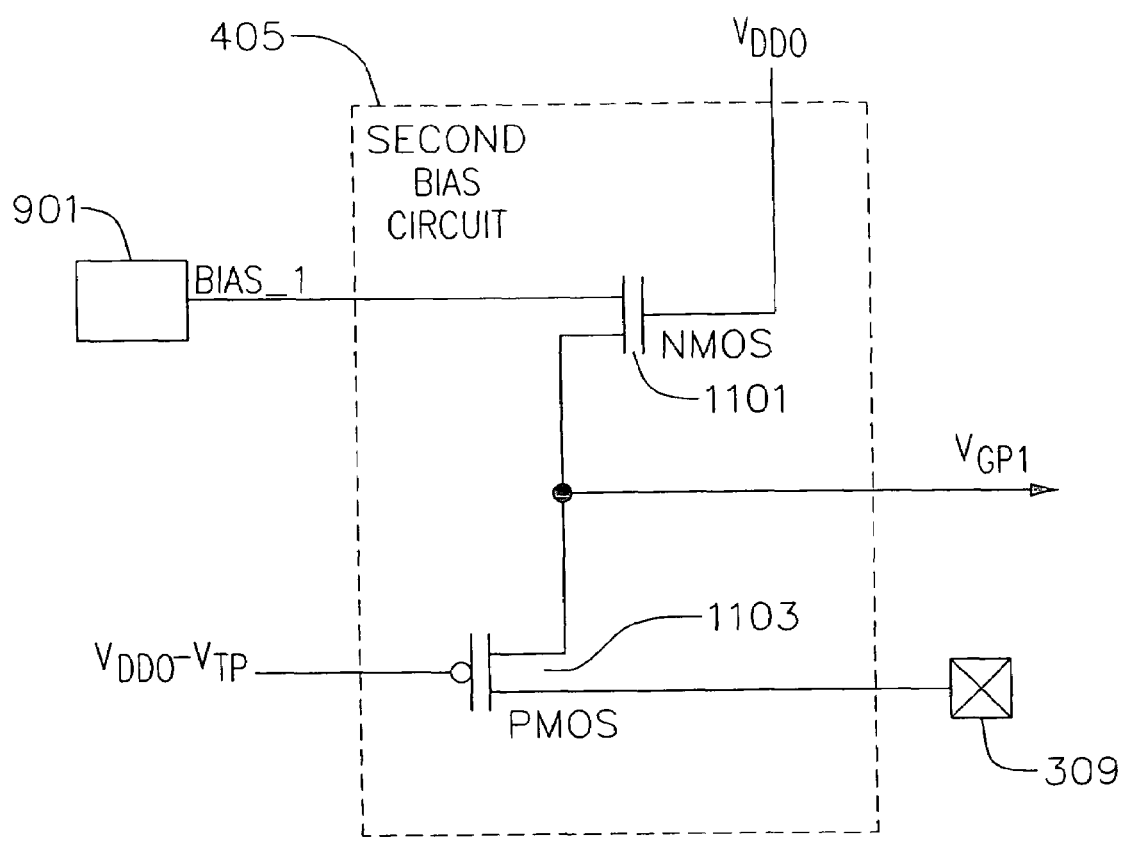
FIG. 11A is a schematic diagram of a circuit used to generate $V_{GP1}$.

FIG. 11A is a schematic diagram of a circuit used to generate $V_{GP1}$. Bias_1 switches between $V_{DDO}$ (3.3 volts) and VDDC (1.2 volts). Device 1101 couples Bias_1 to $V_{GP1}$, When bias_1 is 3.3 volts device 1101 is off and when bias_1 is 1.2 Volts then $V_{GP1}$ is tied to 1.2 Volts. When the $V_{PAD}$ at 309 is greater than $V_{DDO}$ device 1103 begins to conduct, because the gate of device 1103 is tied to ($V_{DDO}-V_{TP}$), and $V_{GP1}$ is thereby coupled to $V_{PAD}$.

Figure 11B:
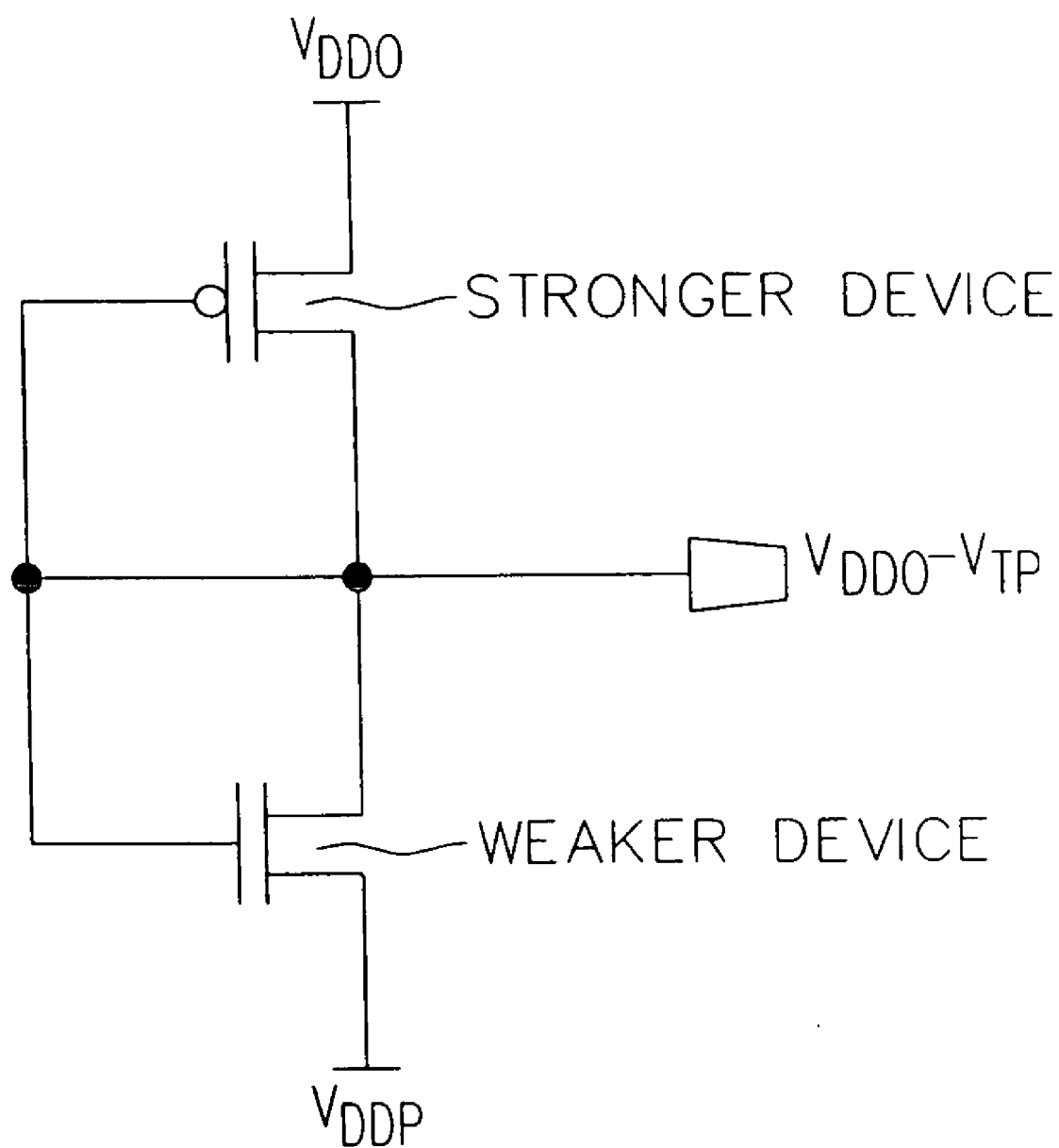
FIG. 11B is a schematic diagram illustration of the generation of $V_{DDO}$-$V_{TP}$ depicted in FIG. 11A.

FIG. 11B shows a circuit which may be used to generate ($V_{DDO}-V_{TP}$). The strong upper PMOS device charges the node 1150 to ($V_{DDO}-V_{TP}$). In addition to the problems that may be caused when a lower supply voltage chip is interfaced with a higher voltage chip "power on stress" problems, which may be caused when circuitry is turned on and the supplies that provide protective biases are not yet up to their full voltage, may exist. In such a case a voltage present at an I/O pad may stress devices which are coupled to that I/O pad.

Figure 11C:
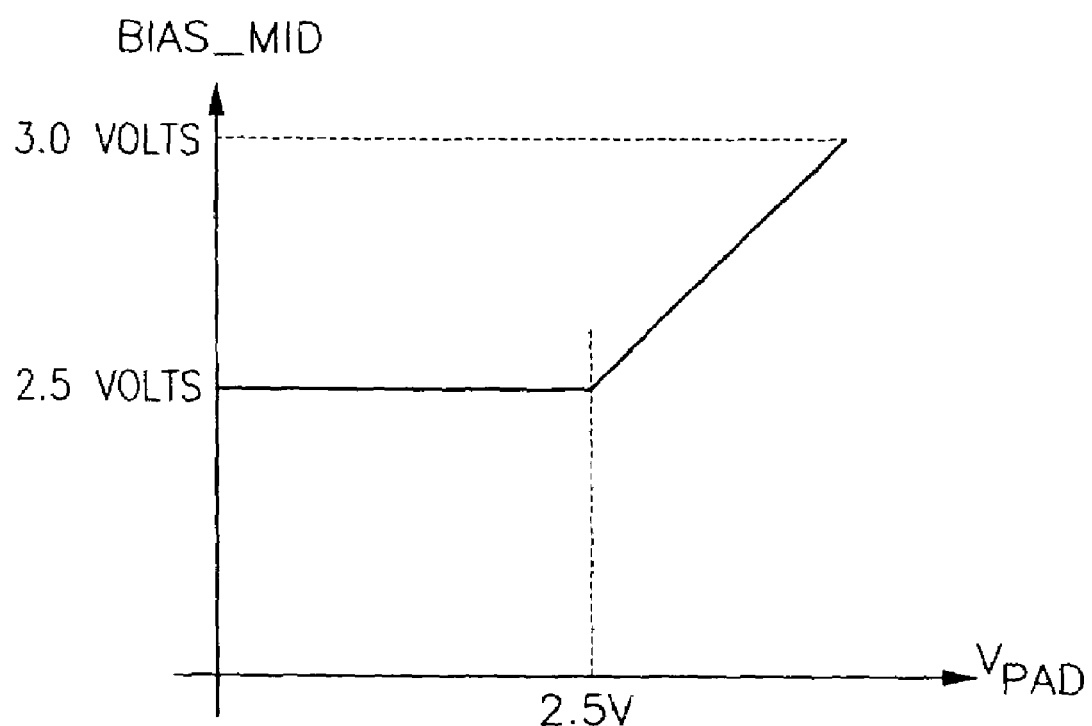
FIG. 11C is a graph illustrating the relationship between Bias_Mid and $V_{PAD}$ according to an embodiment of the invention.

FIG. 11C is a graph illustrating the relationship between Bias_Mid and $V_{PAD}$. Bias_Mid is set at 2.5 volts, and remains at 2.5 volts until $V_{PAD}$ increases beyond 2.5 volts. Thereafter Bias_Mid tracks increases with $V_{PAD}$ and becomes equal to a higher voltage when $V_{PAD}$ increases beyond a certain value.

Figure 11D:
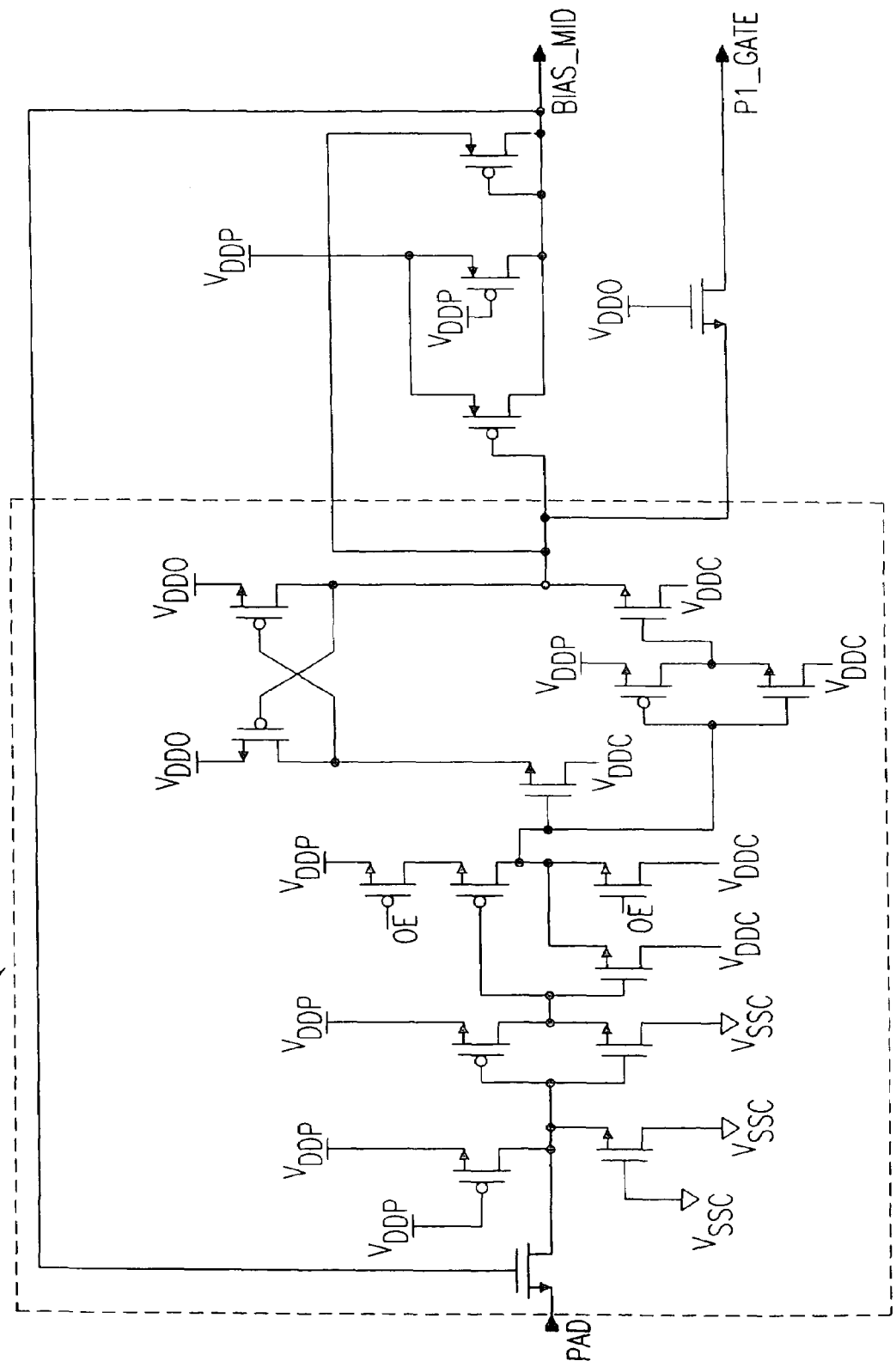
FIG. 11D is a schematic diagram depicting an exemplary illustration of a transistor implementation of block 901.

FIG. 11D is a schematic diagram depicting an exemplary illustration of a transistor implementation of block 901.

Figure 12:
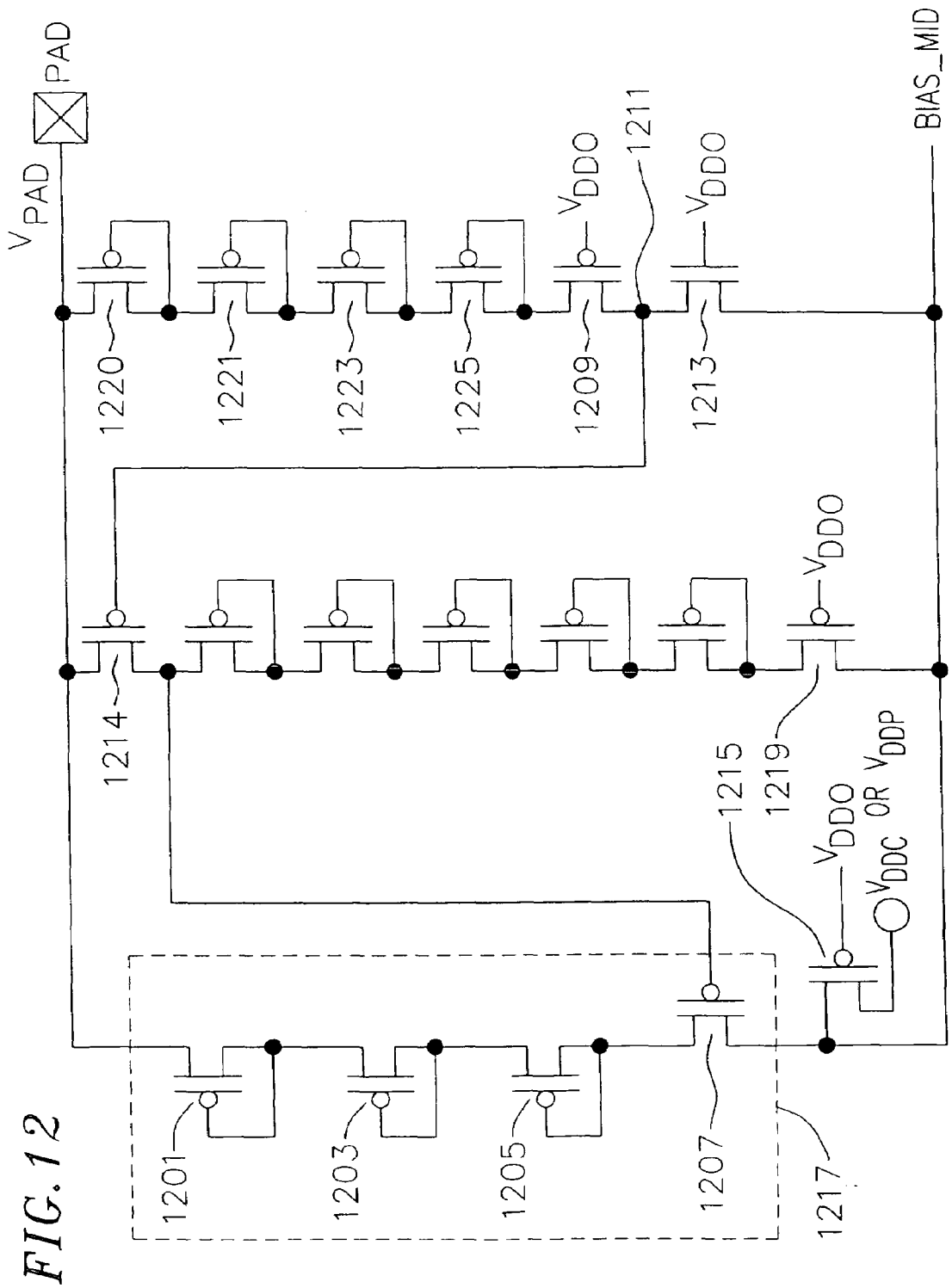
FIG. 12 is a schematic diagram of a circuit that may be used to prevent power on stress of devices, according to an embodiment of the invention.

FIG. 12 is a schematic diagram of a circuit that may be used to prevent power on stress of devices, according to an embodiment of the invention. The circuit illustrated in FIG. 12 may be used to generate the Bias_Mid voltage when $V_{DDO}$ is not up to its nominal value. If Bias_Mid is present then devices 305 and 307, shown in FIG. 8, will be protected from junction over voltage problems even though the voltages, which ordinarily would be used to generate Bias_Mid as explained in FIG. 9, are not present.

In FIG. 12 devices 1201, 1203, and 1205 are arranged as a series of diode coupled transistors such that a threshold voltage $V_{TP}$ (in the present example equal to approximately 0.5 volts) is dropped across each device when it is conducting. When device 1207 is conducting, the pad voltage, minus the threshold voltage of devices 1201, 1203, 1205 and 1207, is coupled to Bias_Mid. Device 1207, in essence, acts as a switch.

As an example, assume that $V_{DDO}$ is initially zero volts. Zero volts at the gate of device 1209 turns it on. In such case point 1211 charges to a potential close to the pad voltage, since device 1213 is off. Point 1211 is coupled to the gate of device 1214 thereby turning device 1214 off. Since $V_{DDO}$ is zero volts, PMOS device 1219 turns on, which leads the gate of device 1207 being coupled to Bias_Mid. This leads to coupling the pad voltage, minus the threshold voltage of devices 1201, 1203, 1205 and 1207 to Bias_Mid. When $V_{DDO}$ is low, device 1215 provides a current leakage path for Bias_Mid to $V_{DDC}$ or $V_{DDP}$. When $V_{DDO}$ is low, string 1217 turns on and the pad voltage is coupled to Bias_Mid. Devices 1220, 1221, 1223 and 1225 act as protection for device 1209 in the instance where the $V_{PAD}$ is high and $V_{DDO}$ is low.

When $V_{DDO}$ is high, point 1211 is tied to Bias_Mid because device 1213 turns on. When $V_{DDO}$ is high, device 1219 is turned off and device 1213 is turned on, thus raising the potential at the base of device 1207 to $V_{PAD}$, thereby turning device 1207 off. Also device 1215 turns off when $V_{DDO}$ is high.

Figure 13:
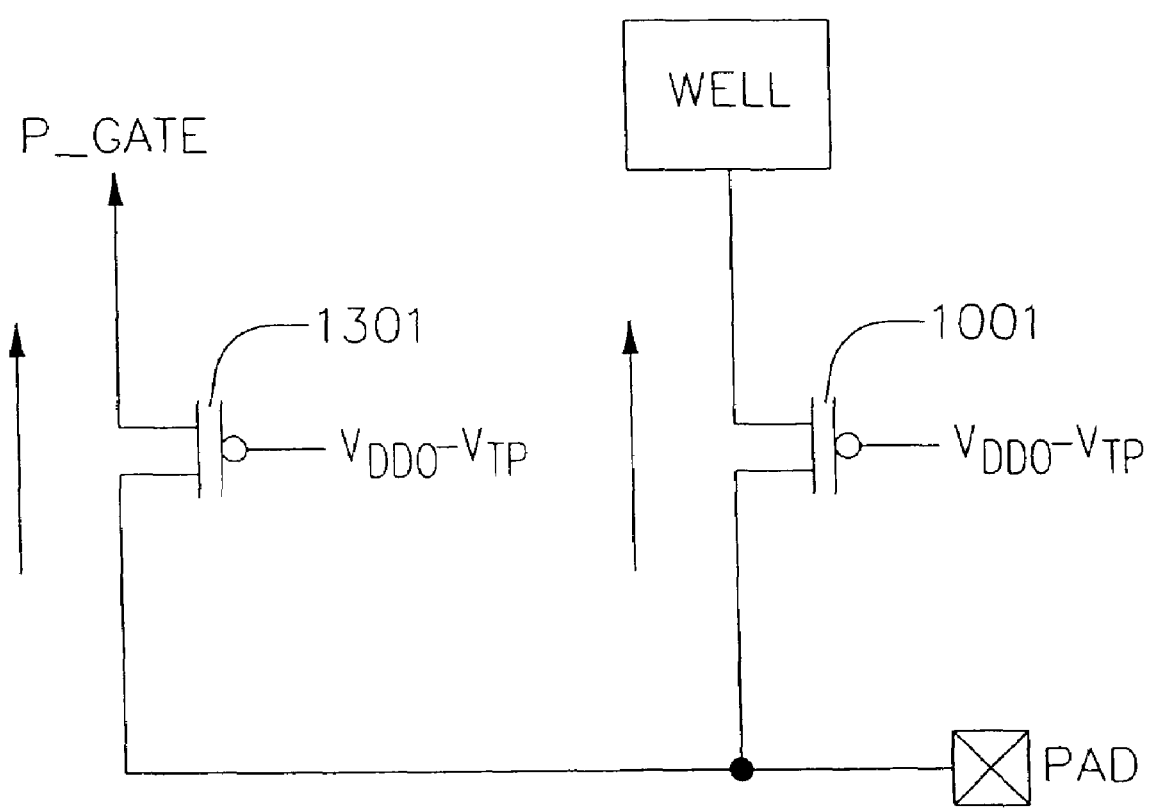
FIG. 13 is a circuit and block diagram of a portion of an over voltage protection circuit.

FIG. 13 is a circuit and block diagram of a portion of an over voltage protection circuit. Device 1001 provides a protection mechanism for the well bias. If $V_{DDO}$ is lower than the pad voltage by $V_{TP}$ or more then device 1001 will turn on. If device 1001 turns on then the well is coupled, via device 1001, to the pad, and hence the well will be biased to $V_{PAD}$.

Similarly device 1301 is coupled between the pad and P_Gate, the gate of PMOS device 303 shown in FIG. 6. The gate of device 1301 is biased so that when $V_{DDO}$ is lower than the pad voltage by $V_{TP}$ or more, then device 1301 will turn on and couple P_Gate to the pad voltage, therefore if $V_{DDO}$ is low then P_Gate will not depend on $V_{DDO}$ for it's voltage level and instead will take the voltage level from the voltage on the pad.

Figure 14:
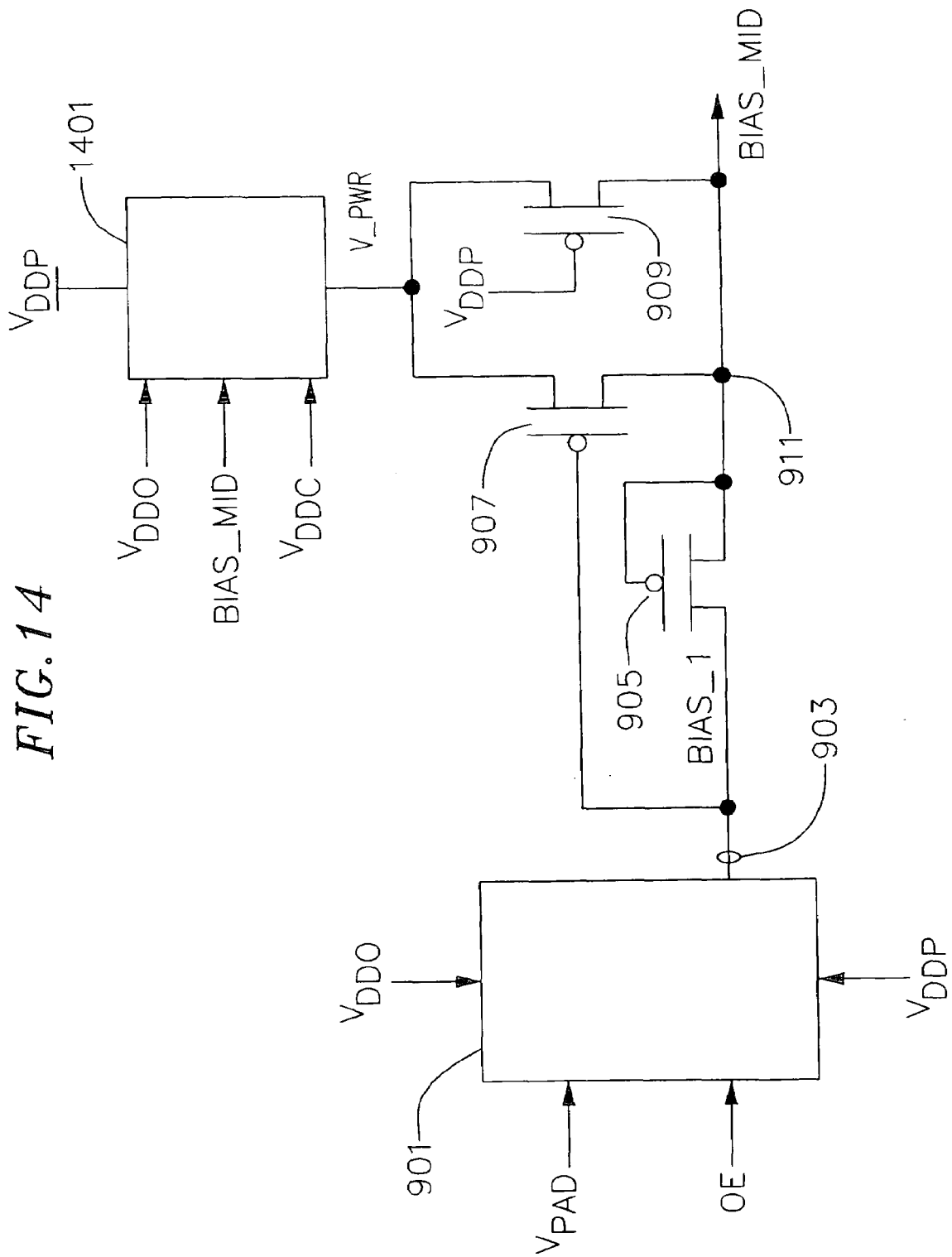
FIG. 14 is a schematic diagram illustrating a modification of FIG. 9A.

FIG. 14 is a schematic diagram illustrating a modification of FIG. 9. In FIG. 14 block 901 is decoupled from the Bias_Mid signal when $V_{DDO}$ is lower than its nominal value. The decoupling is done by using block 1401. When $V_{DDO}$ is not up to its nominal value, the node V_pwr is decoupled from $V_{DDP}$ by using block 1401 as a switch. When $V_{DDO}$ is up to its nominal value, the node V_pwr is coupled to $V_{DDP}$ by using block 1401.

Figure 15:
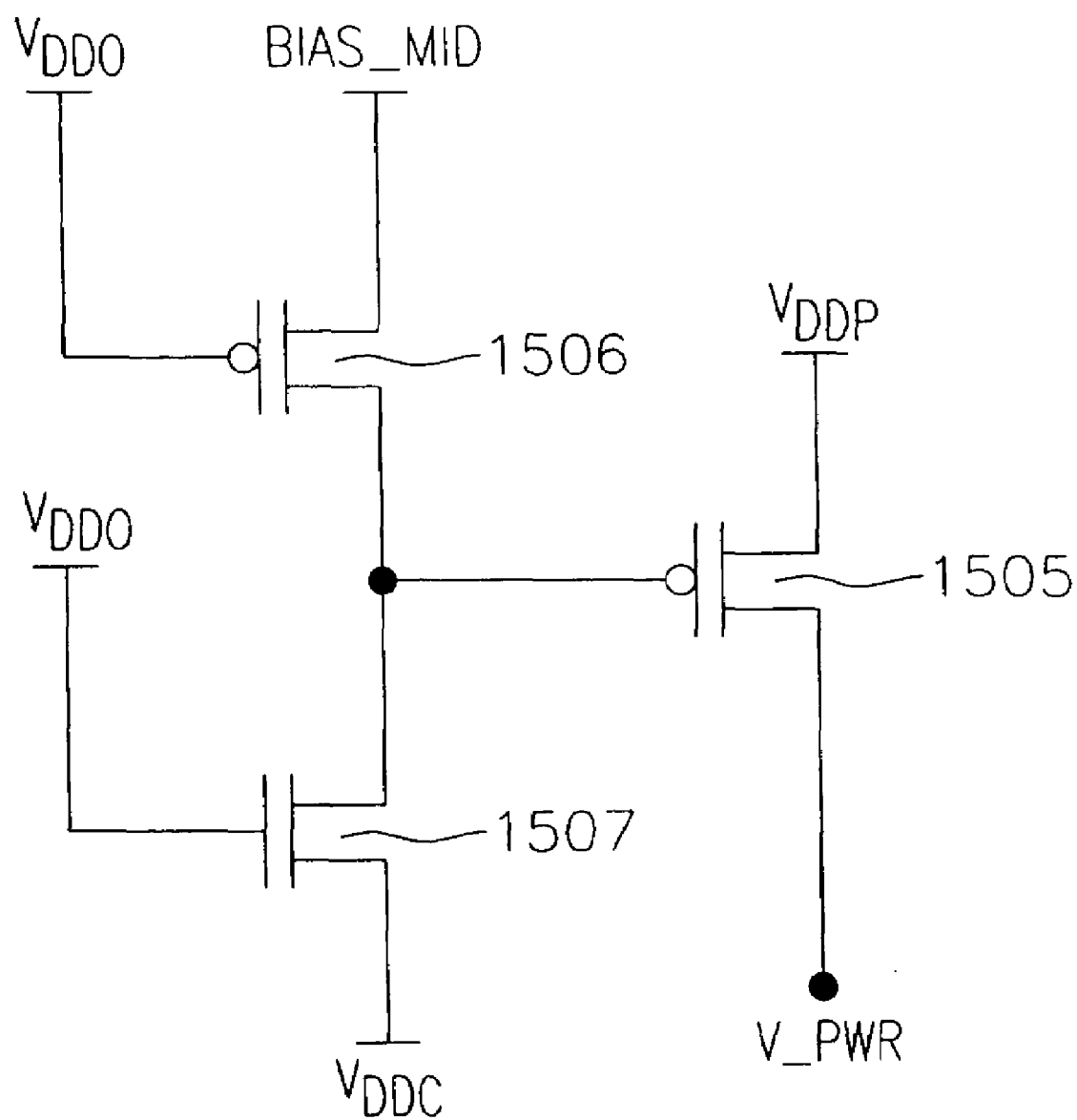
FIG. 15 is a schematic diagram illustrating a transistor implementation of block 1401.

FIG. 15 is a schematic diagram illustrating a transistor implementation of block 1401. When $V_{DDO}$ is greater than a certain value, NMOS 1507 is turned on thereby connecting the gate of PMOS 1505 to $V_{DDC}$. Connecting the gate of of PMOS 1505 to $V_{DDC}$ turns on 1505 thereby connecting V_pwr to $V_{DDP}$. When $V_{DDO}$ is less than a certain value, NMOS 1507 is turned off and PMOS 1506 is turned on thereby connecting the gate of PMOS 1505 to Bias_Mid, thereby turning off PMOS 1505 and disconnecting V_pwr from $V_{DDP}$.

Figure 16:
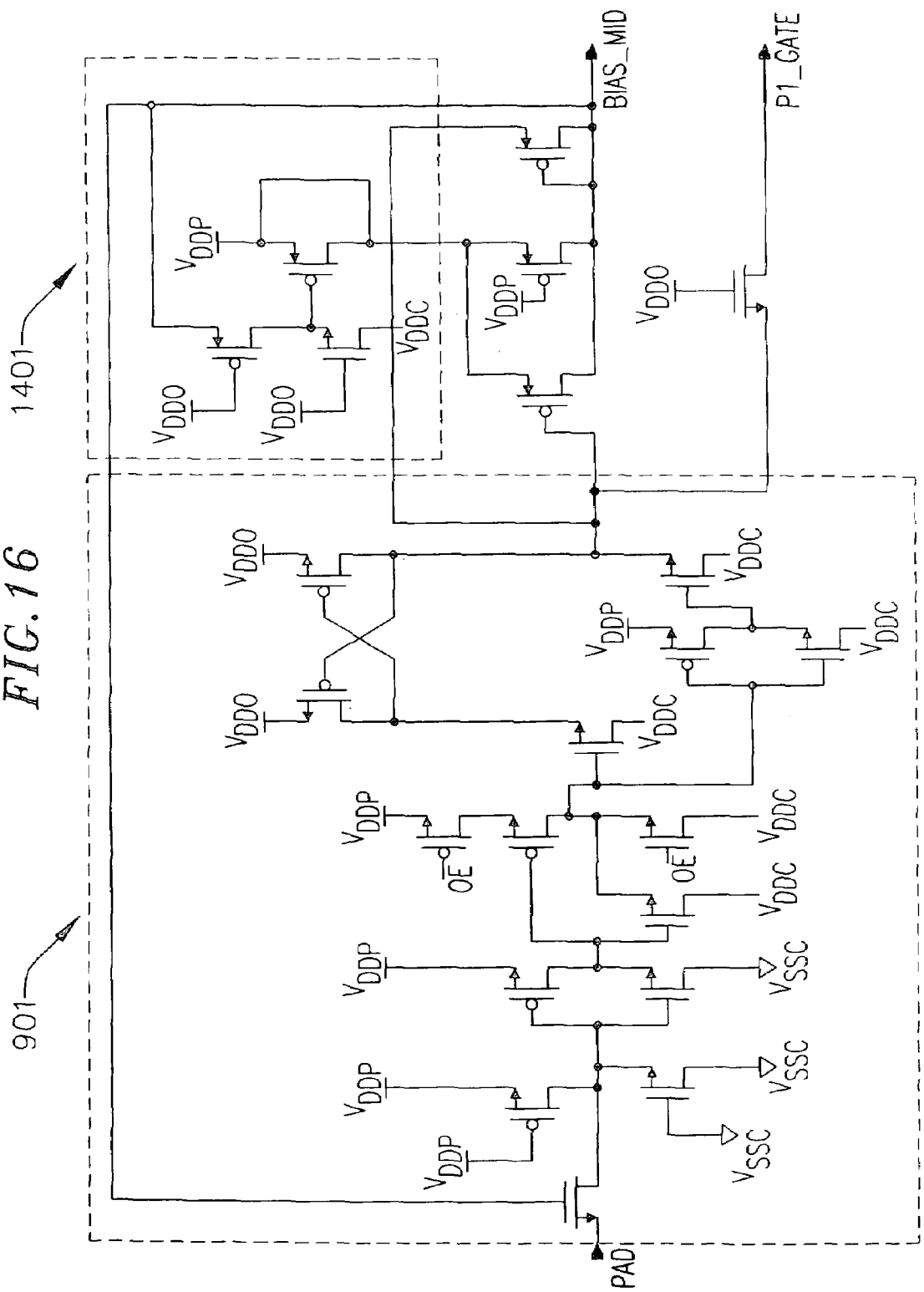
FIG. 16 is a schematic diagram illustrating a transistor implementation of FIG. 14.

FIG. 16 is a schematic diagram illustrating a transistor implementation of the circuitry illustrated in FIG. 14.

Figure 17:
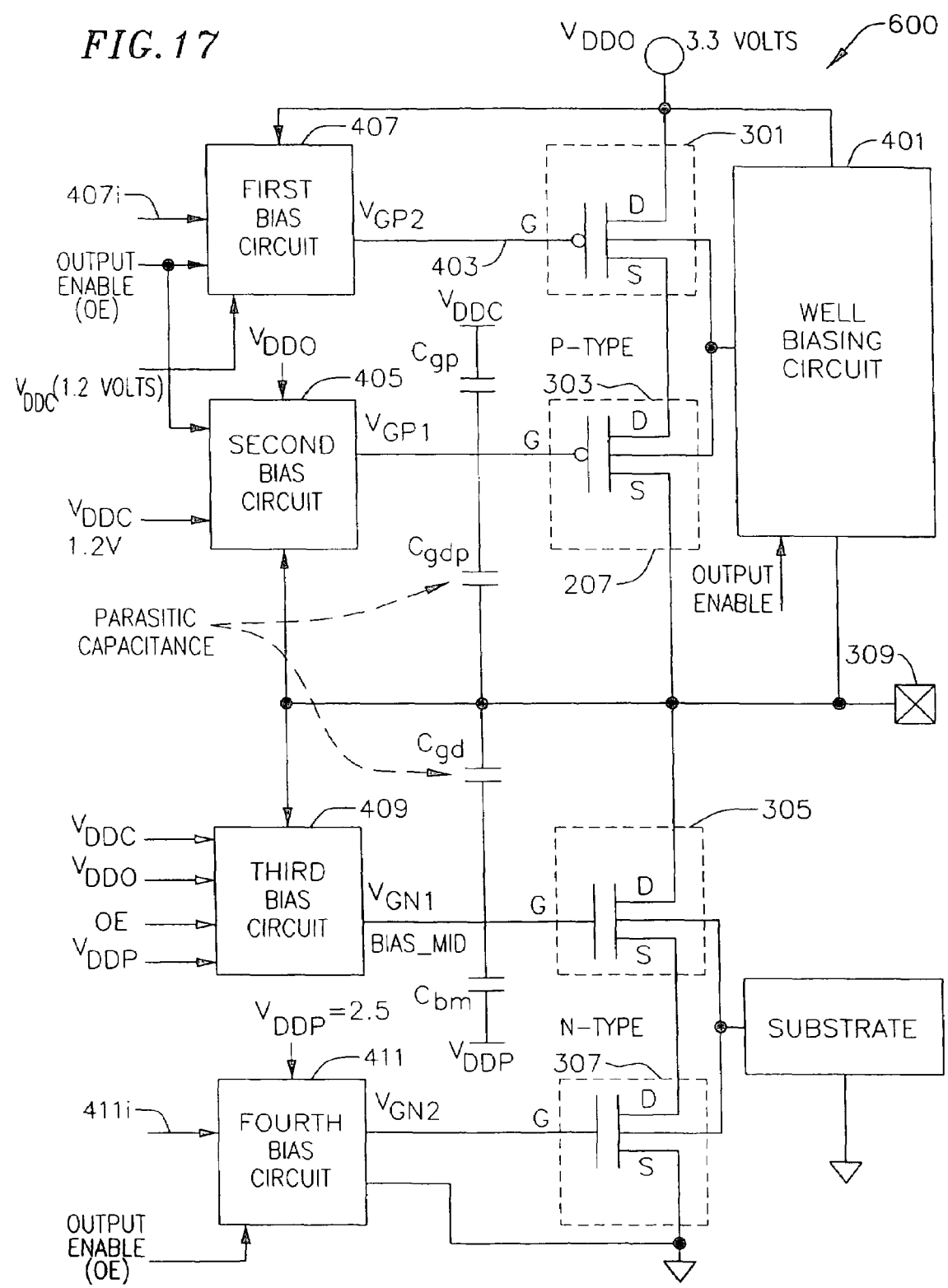
FIG. 17 is a schematic diagram of a circuit that may be used to prevent stress on devices when voltage spikes appear at an I/O pad.

FIG. 17 is a schematic diargam of a circuit that may be used to prevent stress on devices when voltage spikes appear at an I/O pad. When transient voltages appear, the Bias_Mid voltage changes momentarily due to the gate to drain overlap capicitance (Cgd) of the driver NMOS. A capacitance (Cbm) is placed at the bias_mid node such that the transient voltage at the pad (V_pad,transient) gets divided between Cgd and Cbm depending on the ratio of the capacitances which gives the additional transient voltage on bias_mid(V_bm,transient):

$\Delta V\_bm$, transient=(Cgd/(Cgd+Cbm)*$\Delta V\_pad$, transient.

Also, when transient voltages appear, the voltage $V_{GP1}$ on PMOS 207 gate changes momentarily due to the gate to drain overlap capicitance (Cgdp) of the driver PMOS. A capacitance (Cgp) is placed at the PMOS 207 gate node such that the transient voltage at the pad (V_pad,transient) gets divided between Cgdp and Cgp depending on the ratio of the capacitances which gives the additional transient voltage on PMOS 207 gate ($V_{GP1+}$transient):

$\Delta(V_{GP1+}\text{transient}) = (Cgdp/(Cgdp+Cgp))*\Delta(V\_pad,\text{transient})$.

Figure 18:
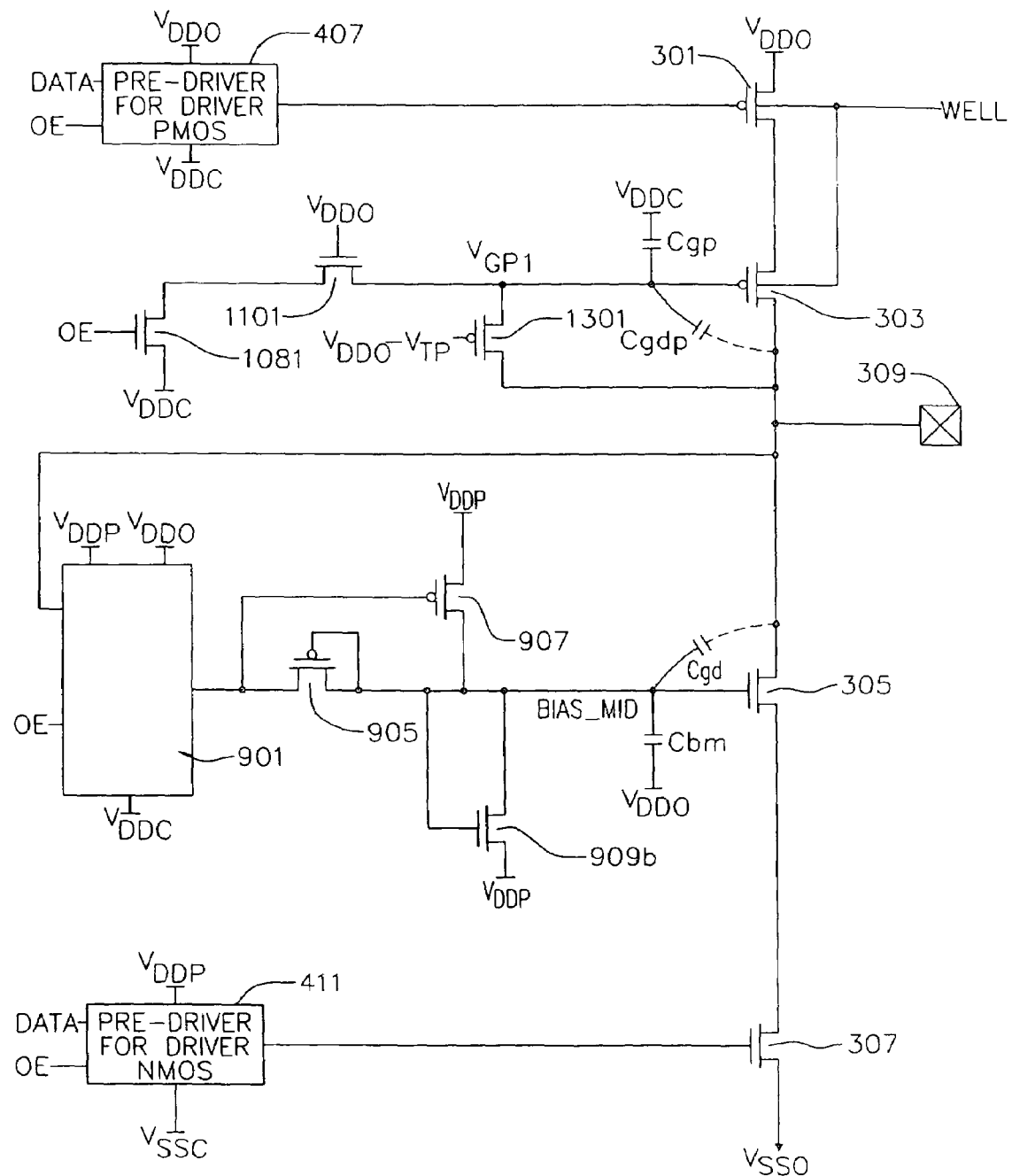
FIG. 18 is a schematic diagram of a circuit including several previously illustrated embodiments of the invention.

FIG. 18 is a schematic diagram of a circuit including several previously illustrated embodiments of the invention. The transistors illustrated in FIG. 18 are all 2.5 volt devices. The maximum output pad voltage is 3.6 volts and the maximum input voltage is 5.5 volts. The typical values of power supplies are $V_{DDO}$=3.3 volts, $V_{DDP}$=2.5 volts, $V_{DDC}$=1.2 volts, $V_{SSC}$=0 volts and $V_{SSO}$=0 volts. The operation of the circuit of FIG. 18 under various operating conditions is summarized below.

When the I/O pad 309 is in an output enabled mode (i.e. OE is high) the maximum pad voltage is $V_{DDO}$–$V_{GP1}$ at the gate of PMOS device 303 is coupled to $V_{DDC}$ through NMOS transistors 1101 and 1801 and accordingly PMOS device 303 is turned on. Block 901 generates an output Bias_1 voltage of $V_{DDC}$ and accordingly PMOS device 907 is turned on, the steady state voltage of Bias_Mid is $V_{DDP}$ and PMOS device 905 is turned off.

When the I/O pad 309 is output disabled (i.e. OE is low) and the pad voltage is below a predetermined value, then $V_{GP1}$ at the gate of PMOS 303 is floating if the pad voltage is below $V_{DDO}$. Block 901 generates a output Bias_1 voltage of $V_{DDC}$ and accordingly PMOS device 907 is turned on, the steady value of Bias_Mid voltage is $V_{DDP}$, and PMOS device 905 is turned-off in this condition.

When the I/O pad 309 is output disabled (i.e. OE is low) and the pad voltage is above a predetermined value, then block 901 generates an output Bias_1 voltage of $V_{DDO}$ and accordingly PMOS device 907 is turned-off, PMOS device 905 is is turned on, and the steady state value of Bias_Mid is between ($V_{DDO}$–$V_{Tp}$) as a minimum value and ($V_{DDP}$+$V_t$) as a maximum value, where $V_{Tp}$ and $V_t$ are offset voltages due to the turn on threshold voltages of transistors 905 and 909b respectively. $V_{GP1}$, at the gate of PMOS device 303 is coupled to the pad voltage if the pad voltage is greater than $V_{DDO}$.

Capacitors $C_{bm}$ and $C_{gp}$ in FIG. 18 are used to insure that Bias_Mid voltage and $V_{GP1}$ voltage, respectively, are kept at desirable levels when transient voltages appear at the pad as was described relative to FIG. 17.

What is claimed is:

1. An apparatus for generating a first bias voltage, the apparatus comprising:
   a first input for accepting a pad voltage;
   an second input for accepting a second bias voltage, the second input having a corresponding output, the second bias voltage having a first voltage level when the corresponding output is enabled and having a second voltage level when the corresponding output is disabled; and
   a circuit for providing the first voltage level of the second bias voltage as the first bias voltage when the pad voltage is less than the second voltage level of the second bias voltage and for providing the pad voltage as the first bias voltage otherwise,
   wherein the second voltage level of the second bias voltage is greater than the first voltage level of the second bias voltage.

2. The apparatus of claim 1, wherein the second voltage level is about 3.3 Volts and the first voltage level is about 1.2 Volts.

3. The apparatus of claim 1, wherein the second input and the corresponding output are provided via an N-channel Metal Oxide Semiconductor (NMOS) and the first input is provided via a P-channel Metal Oxide Semiconductor (PMOS).

4. The apparatus of claim 3, wherein the first bias voltage is generated between the NMOS and the PMOS.

5. The apparatus of claim 3, wherein the second voltage level minus an offset voltage level is at a gate of the PMOS.

6. The apparatus of claim 5, wherein the offset voltage level is equal to a threshold voltage of a transistor.

7. The apparatus of claim 3, wherein the second voltage level is at a gate of the NMOS.

* * * * *